United States Patent
Asami

(10) Patent No.: US 8,629,490 B2
(45) Date of Patent: Jan. 14, 2014

(54) NONVOLATILE SEMICONDUCTOR STORAGE DEVICE WITH FLOATING GATE ELECTRODE AND CONTROL GATE ELECTRODE

(75) Inventor: Yoshinobu Asami, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 499 days.

(21) Appl. No.: 11/717,759

(22) Filed: Mar. 14, 2007

(65) Prior Publication Data

US 2007/0228452 A1 Oct. 4, 2007

(30) Foreign Application Priority Data

Mar. 31, 2006 (JP) ................ 2006-101254

(51) Int. Cl.
*H01L 29/788* (2006.01)

(52) U.S. Cl.
USPC ........................................ 257/316; 257/315

(58) Field of Classification Search
USPC .......................................... 257/316, 10, 315
See application file for complete search history.

(56) References Cited

U.S. PATENT DOCUMENTS

| | | | |
|---|---|---|---|
| 5,275,851 A | 1/1994 | Fonash et al. | |
| 5,576,637 A | 11/1996 | Akaogi et al. | |
| 5,592,419 A | 1/1997 | Akaogi et al. | |
| 5,608,670 A | 3/1997 | Akaogi et al. | |
| 5,619,450 A | 4/1997 | Takeguchi | |
| 5,631,597 A | 5/1997 | Akaogi et al. | |
| 5,640,123 A | 6/1997 | Akaogi et al. | |
| 5,770,963 A | 6/1998 | Akaogi et al. | |
| 5,789,292 A | 8/1998 | Yamazaki et al. | |
| 5,888,868 A | 3/1999 | Yamazaki et al. | |
| 5,949,706 A * | 9/1999 | Chang et al. ........... | 365/156 |
| 6,323,515 B1 | 11/2001 | Yamazaki et al. | |
| 6,335,716 B1 | 1/2002 | Yamazaki et al. | |
| 6,472,684 B1 | 10/2002 | Yamazaki et al. | |

(Continued)

FOREIGN PATENT DOCUMENTS

| | | |
|---|---|---|
| CN | 1319781 | 10/2001 |
| EP | 0 570 597 | 11/1993 |

(Continued)

OTHER PUBLICATIONS

Office Action (Application No. 200710091492.X) Dated Nov. 27, 2009.

*Primary Examiner* — Howard Weiss
*Assistant Examiner* — Tifney Skyles
(74) *Attorney, Agent, or Firm* — Eric J. Robinson; Robinson Intellectual Property Law Office, P.C.

(57) ABSTRACT

It is an object to provide a nonvolatile semiconductor storage device that prevents increase in a contact resistance value due to etching of a semiconductor layer when etching an interlayer insulating film and that has superiority in a writing characteristic and an electric charge-holding characteristic, and a manufacturing method thereof. A conductive layer is provided between a source or drain region and a source or drain wiring. The conductive layer is made of the same conductive layer that forms a control gate electrode. An insulating film is provided so as to cover the conductive layer, and the insulating film has a contact hole for exposing part of the conductive layer. The source or drain wiring is formed so that the contact hole is filled.

18 Claims, 29 Drawing Sheets

(56) References Cited

U.S. PATENT DOCUMENTS

| | | |
|---|---|---|
| 6,509,602 B2 | 1/2003 | Yamazaki et al. |
| 6,597,034 B2 | 7/2003 | Yamazaki et al. |
| 6,756,640 B2 | 6/2004 | Yamazaki et al. |
| 6,812,491 B2 | 11/2004 | Kato et al. |
| 6,888,191 B2 * | 5/2005 | Aoki .............................. 257/315 |
| 6,900,499 B2 | 5/2005 | Yamazaki et al. |
| 7,078,769 B2 | 7/2006 | Yamazaki et al. |
| 7,218,361 B2 | 5/2007 | Yamazaki et al. |
| 7,247,562 B2 * | 7/2007 | Ishikawa ....................... 438/666 |
| 7,368,338 B2 | 5/2008 | Yamazaki et al. |
| 7,378,286 B2 | 5/2008 | Hsu et al. |
| 7,486,344 B2 | 2/2009 | Yamazaki et al. |
| 7,495,278 B2 | 2/2009 | Yamazaki et al. |
| 7,652,321 B2 | 1/2010 | Yamaguchi et al. |
| 7,989,873 B2 | 8/2011 | Yamazaki et al. |
| 8,198,680 B2 | 6/2012 | Ishikawa |
| 2001/0052950 A1 * | 12/2001 | Yamazaki et al. .............. 349/43 |
| 2002/0072173 A1 | 6/2002 | Aoki |
| 2002/0079484 A1 * | 6/2002 | Yamazaki et al. .............. 257/10 |
| 2005/0041122 A1 | 2/2005 | Yamazaki et al. |
| 2007/0145468 A1 * | 6/2007 | Majumdar et al. ............ 257/316 |
| 2007/0252210 A1 | 11/2007 | Ishikawa |
| 2012/0238085 A1 | 9/2012 | Ishikawa |

FOREIGN PATENT DOCUMENTS

| | | |
|---|---|---|
| EP | 0 944 094 | 9/1999 |
| EP | 0 954 102 | 11/1999 |
| EP | 0 961 289 | 12/1999 |
| EP | 0 961 290 | 12/1999 |
| EP | 1 168 362 | 1/2002 |
| EP | 1 168 365 | 1/2002 |
| JP | 63-114047A U | 7/1988 |
| JP | 05-189984 | 7/1993 |
| JP | 06-061501 | 3/1994 |
| JP | 11-143379 A | 5/1999 |
| JP | 11-154714 A | 6/1999 |
| JP | 2000-022004 A | 1/2000 |
| JP | 2000-174238 A | 6/2000 |
| JP | 2001-326289 A | 11/2001 |
| JP | 2004-327617 A | 11/2004 |
| JP | 2005-294814 A | 10/2005 |
| JP | 2006-041265 A | 2/2006 |
| JP | 2006-060209 A | 3/2006 |

\* cited by examiner

FIG. 6
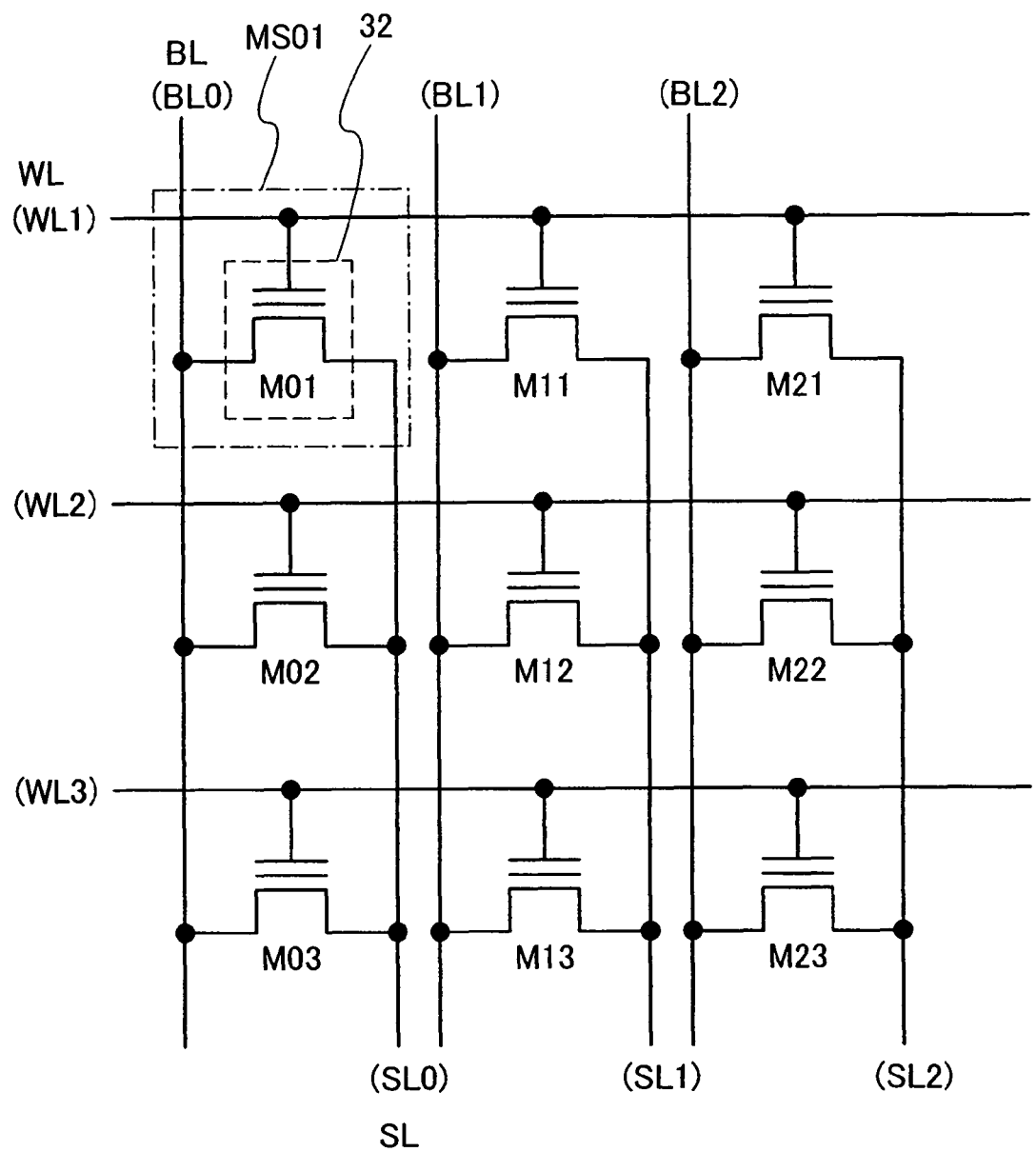
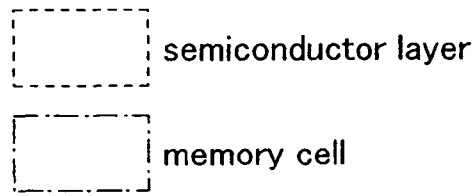

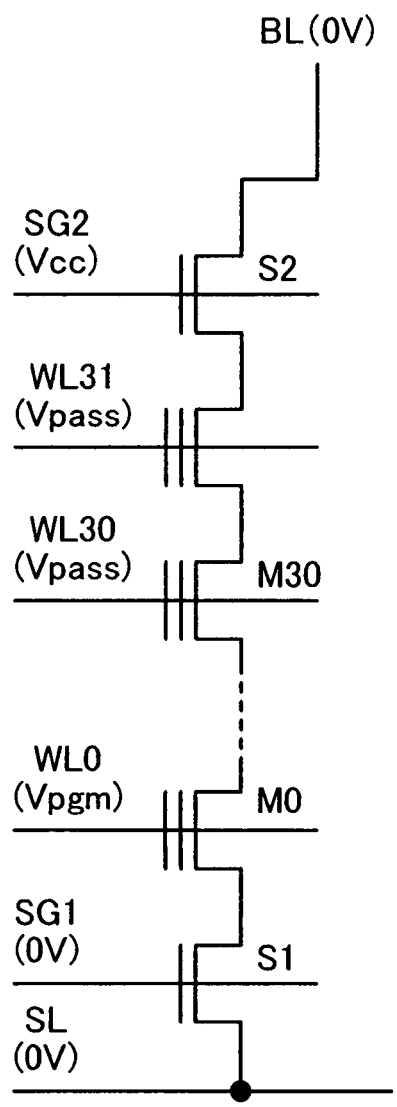
FIG. 8A writing "0"
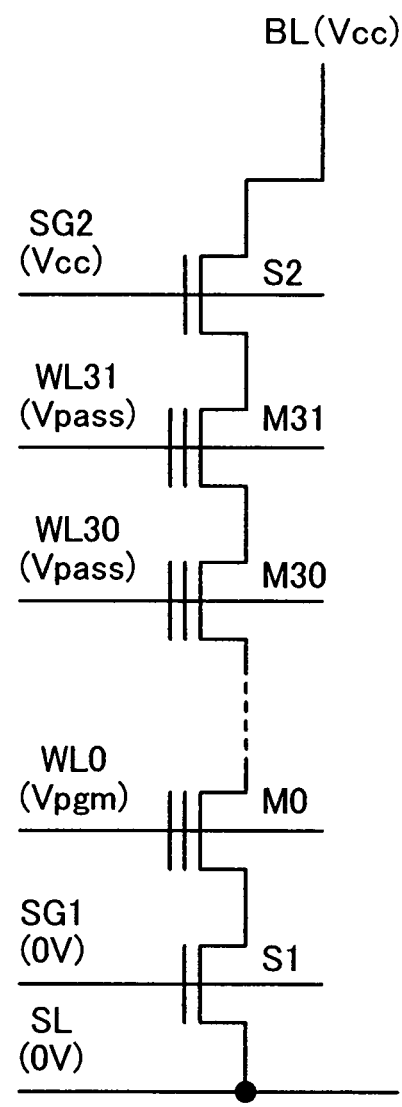
FIG. 8B writing "1"

FIG. 9A  erasing
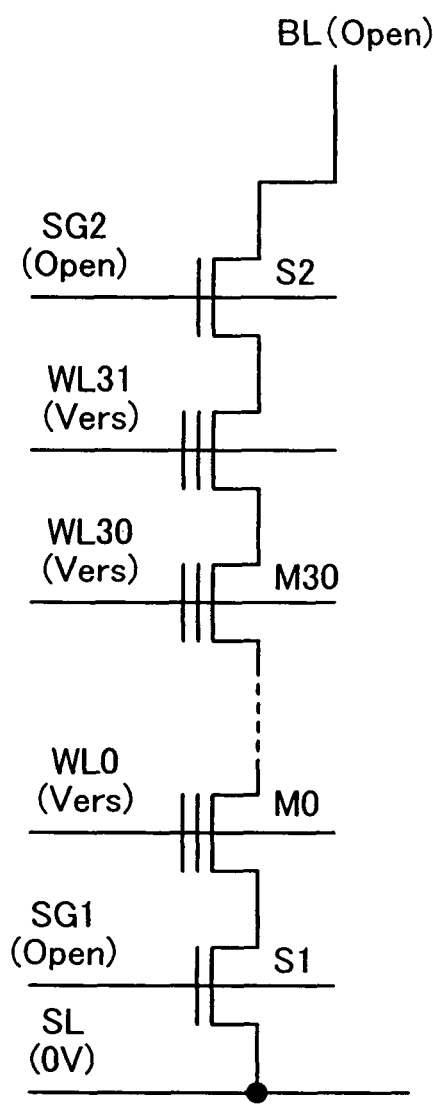
FIG. 9B  reading
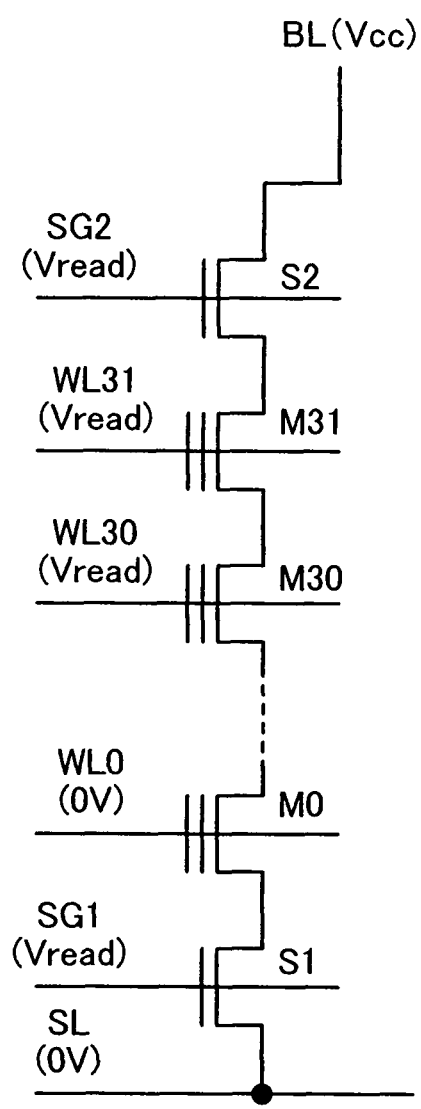

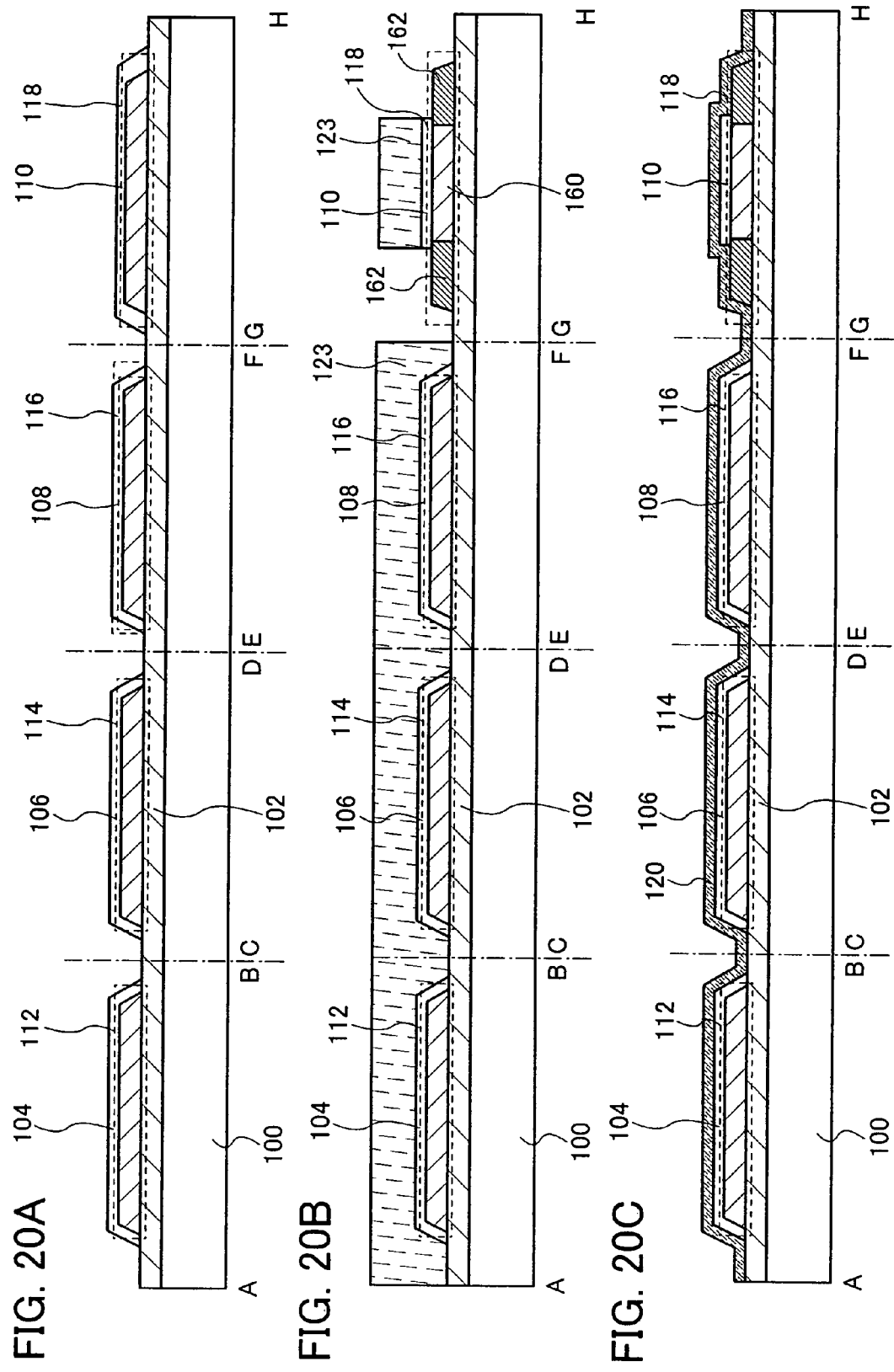

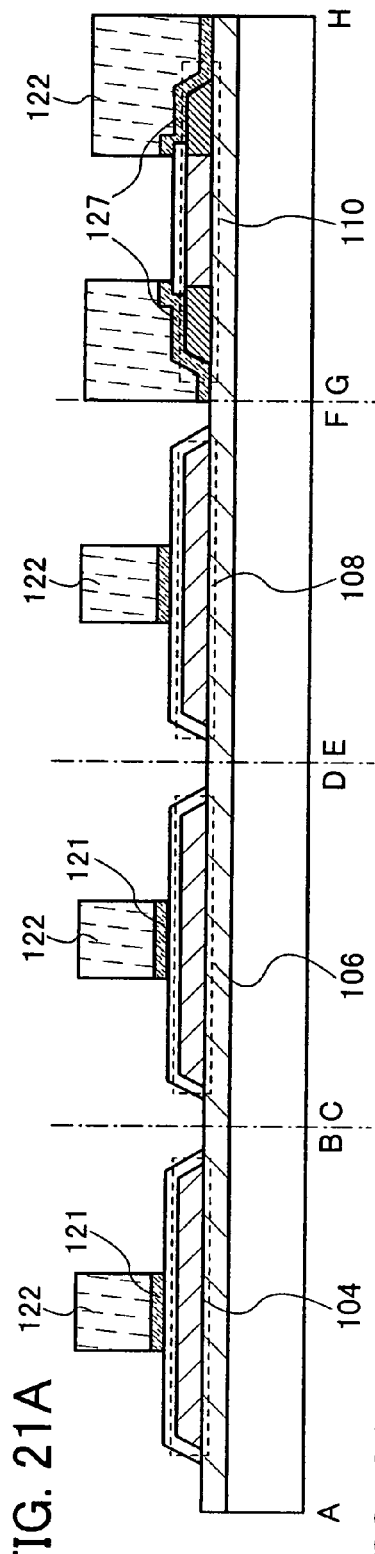
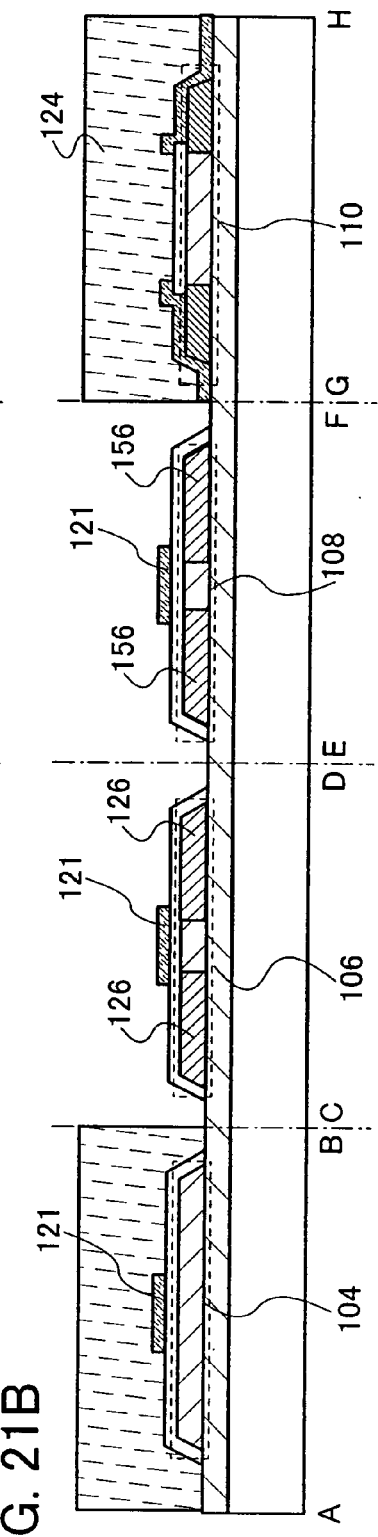
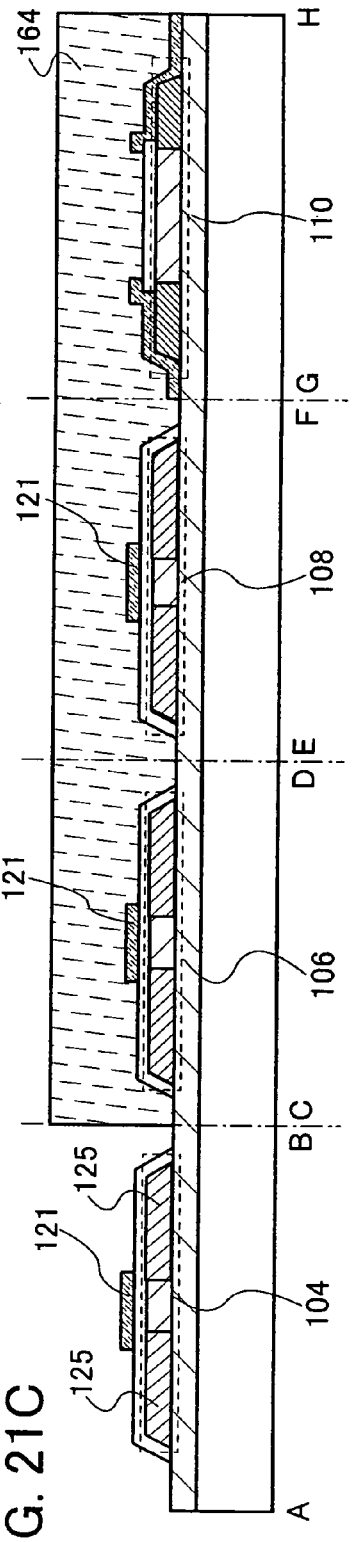
FIG. 21A
FIG. 21B
FIG. 21C

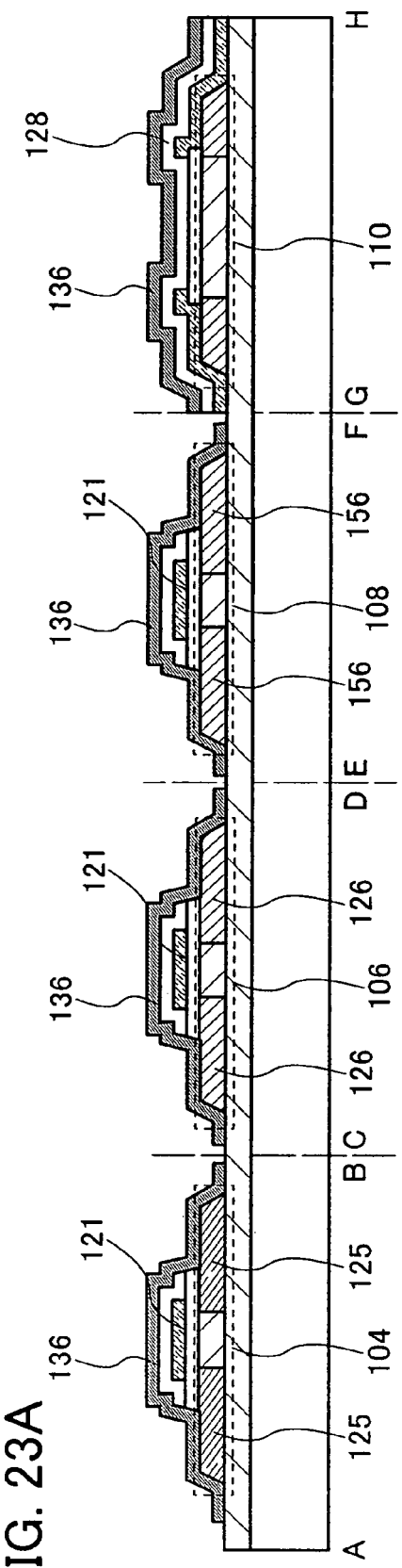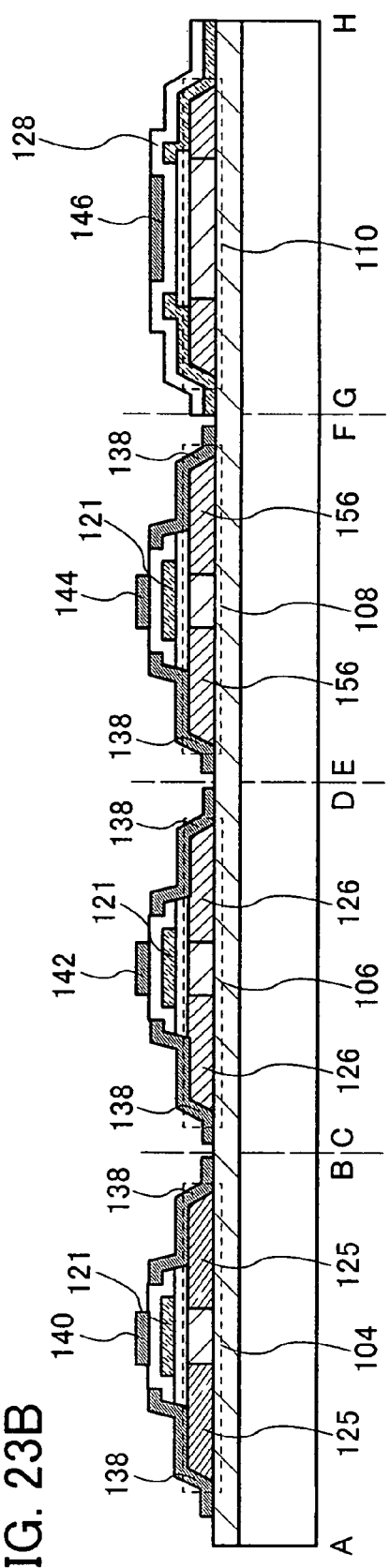

PRIOR ART

NONVOLATILE SEMICONDUCTOR STORAGE DEVICE WITH FLOATING GATE ELECTRODE AND CONTROL GATE ELECTRODE

BACKGROUND OF THE INVENTION

1. Field of the Invention

The present invention relates to a nonvolatile semiconductor storage device that is electrically capable of writing, reading, and erasing and a manufacturing method thereof.

2. Description of the Related Art

A market has been expanded for nonvolatile memories, in which data can be electrically rewritten and data can be stored even after the power is turned off. There is a feature in that a nonvolatile memory has a similar structure to that of a MOSFET (Metal Oxide Semiconductor Field effect transistor) and a region capable of accumulating electric charges for a long period of time is provided over a channel formation region. An electric charge accumulating region of the nonvolatile memory is also referred to as a floating gate because it is formed over an insulating layer and insulated with circumference. A control gate is provided over the floating gate through an insulating layer (for example, Patent Document 1 and Patent Document 2: Japanese Published Patent Application No. H5-189984 and Japanese Published Patent Application No. H6-61501).

A nonvolatile memory, of a so-called floating gate type, having such a structure operates for accumulating electric charges in the floating gate by a voltage applied to a control gate and discharging the electric charges. That is to say, the nonvolatile memory of a floating gate type has a mechanism for storing data by taking out and into the electric charges to be held in the floating gate. Specifically, the electric charges are injected into and drawn from the floating gate by application of a high voltage between a semiconductor layer in which a channel formation region is formed and a control gate. As for such a nonvolatile memory, a technique has been developed, in which a semiconductor storage device is formed over a silicon wafer including an insulating layer, a glass substrate, or a plastic substrate as well as being formed into the silicon wafer.

A nonvolatile semiconductor storage device shown in FIG. 29 is disclosed in Patent Document 2. The nonvolatile semiconductor storage device of FIG. 29 has a channel region 2, a source region 7, and a drain region 8 made of a semiconductor layer, a first insulating film 3, a floating gate 4, a second insulating film 5, a control gate 6, a source electrode 15, a drain electrode 11, and a gate electrode 9 over an insulator 1. The source region 7 and the drain region 8 are formed to be in contact with the source electrode 15 and the drain electrode 11 respectively through contact holes formed in an interlayer film 13.

SUMMARY OF THE INVENTION

In the conventional nonvolatile semiconductor device as shown in FIG. 29, in a case where a thickness of the semiconductor layer is thin and a selection ratio of the interlayer film 13 to the semiconductor layer is insufficient, there is a problem in that the semiconductor layer is etched as well as the interlayer film 13 when contact holes are opened by dry etching, and accordingly a contact resistance value is increased. In a case where a nonvolatile semiconductor device is manufactured using a large-sized glass substrate, the contact resistance value is further increased. However, if the thickness of the semiconductor layer is made to be thick, a margin is to be narrowed when performing laser crystallization (LC). When the thickness of the semiconductor layer is made to be thick in a case of using a SOI substrate, there is a problem in that a parasitic transistor between the source region and the drain region cannot be suppressed, and accordingly, a TFT of a complete depletion layer type cannot be formed.

In a case where the contact hole is opened by wet etching, a selection ratio of the interlayer film to the semiconductor layer can be made to be high unlimitedly. However, in a case of wet etching, a contact hole having a high aspect ratio cannot be formed, and accordingly, high integration is difficult to be obtained.

There is a method in which etching time for opening by dry etching is reduced by making the interlayer film thin so that etching of the semiconductor layer is suppressed. However, in a case where the interlayer film is made to be thin, parasitic capacitance of a wiring of an upper layer and a gate electrode is increased, and accordingly, drive capability as a circuit may be degraded.

In view of the above problem, it is an object of the present invention to provide a nonvolatile semiconductor storage device that has superiority in a writing characteristic and an electric charge-holding characteristic and a manufacturing method thereof.

In a nonvolatile semiconductor storage device of the present invention, a conductive layer is provided between a source or drain region and a source or drain wiring. The conductive layer is made of the same conductive layer that forms a control gate electrode. An insulating film is provided so as to cover the conductive layer, and it is a feature in that the insulating film has a contact hole for exposing a part of a surface of the conductive layer. The source or drain wiring is formed so that the contact hole is filled.

One feature of a nonvolatile semiconductor storage device of the present invention includes a semiconductor layer having a channel formation region, a source region, and a drain region, a first insulating film covering a part of the source region, a part of the drain region and the channel formation region, a floating gate electrode formed over the first insulating film, a second insulating film covering the floating gate electrode, a control gate electrode formed over the second insulating film, a conductive layer formed over the source region and the drain region, a third insulating film formed over the second insulating film, the control gate electrode, and the conductive layer, and a source electrode or a drain electrode in contact with the conductive layer through a contact hole formed in the third insulating film, where the source region or the drain region and the source electrode or the drain electrode are electrically connected through the conductive layer.

Another feature of a nonvolatile semiconductor storage device of the present invention includes a semiconductor layer having a channel formation region, a source region, and a drain region, a first insulating film covering a part of the source region, a part of the drain region and the channel region, a floating gate electrode formed over the first insulating film, a second insulating film covering the floating gate electrode, a control gate electrode formed over the second insulating film, a conductive layer formed over the source region and the drain region, a third insulating film formed over the second insulating film, the control gate electrode, and the conductive layer, and a source electrode or a drain electrode in contact with the conductive layer through a contact hole formed in the third insulating film, where the source region or the drain region and the source electrode or the drain electrode are electrically connected through the conductive layer, the control gate electrode is formed to cover the floating gate electrode through the second insulating film, the control gate electrode is provided with a sidewall, and the sidewall is formed in a step portion of the control gate electrode, which is generated by the floating gate electrode.

One feature of a method for manufacturing a nonvolatile semiconductor storage device of the present invention includes the steps of forming a channel formation region, a source region, and a drain region in a semiconductor layer, forming a first insulating film to cover the source region and the drain region and the channel formation region, forming a floating gate electrode over the first insulating film, forming a second insulating film to cover the floating gate electrode, exposing a part of the source region and a part of the drain region by etching a part of the first insulating film and a part of the second insulating film, forming a first conductive layer over the second insulating film, the exposed source region, and the exposed drain region, forming a control gate electrode over the second insulating film and a second conductive layer over the exposed source region and the exposed drain region by etching the first conductive layer, forming a third insulating film over the second insulating film, the control gate electrode, and the second conductive layer, opening a contact hole for exposing a part of the second conductive layer in the third insulating film, and forming a source electrode or a drain electrode over the exposed second conductive layer.

Another feature of a method for manufacturing a nonvolatile semiconductor storage device of the present invention includes the steps of forming a channel formation region, a source region, and a drain region in a semiconductor layer, forming a first insulating film to cover the source region and the drain region and the channel formation region, forming a floating gate electrode over the first insulating film, forming a second insulating film to cover the floating gate electrode, exposing a part of the source region and a part of the drain region by etching a part of the first insulating film and the second insulating film, forming a first conductive layer over the second insulating film, the exposed source region, and the exposed drain region, forming a third insulating film over the first conductive layer, forming a sidewall in a step portion generated by the floating gate electrode by etching the third insulating film, forming a control gate electrode over the second insulating film and a second conductive layer over the exposed source region and the exposed drain region by etching the first conductive layer, forming a fourth insulating film over the second insulating film, the control gate electrode, and the second conductive layer, opening a contact hole for exposing a part of the second conductive layer in the fourth insulating film, and forming a source electrode or a drain electrode over the exposed second conductive layer.

One feature of the present invention is that, as a material of the floating gate electrode, germanium or a germanium compound, an oxide of germanium or a germanium compound or a nitride of germanium or a germanium compound, or an oxide including germanium or a germanium compound or a nitride including germanium or a germanium compound is used.

Another feature of the present invention is that the floating gate electrode has a stacked structure of a first floating gate electrode and a second floating gate electrode.

Another feature of the present invention is that the first floating gate electrode is provided on the first insulating film side, and the second floating gate electrode having a shorter width than the first floating gate electrode is provided over the first floating gate electrode.

Another feature of the present invention is that, as a material of the first floating gate electrode, germanium or a germanium compound, an oxide of germanium or a germanium compound or a nitride of germanium or a germanium compound, an oxide including germanium or a germanium compound or a nitride including germanium or a germanium compound is used, and, as a material of the second floating gate electrode, silicon or a silicon compound is used.

When the conductive layer is provided between the source or drain region and the source or drain wiring and the contact hole is formed by etching the insulating layer, etching up to the semiconductor layer is not performed, and accordingly, increase in a contact resistance value can be prevented. Therefore, a nonvolatile semiconductor storage device that is capable of writing with high efficiency at a low voltage and has a favorable electric charge-holding characteristic can be manufactured.

Since the conductive layer provided between the source or drain region and the source or drain wiring is formed using a control gate electrode material, a nonvolatile semiconductor storage device having superior characteristics can be manufactured without losing productivity. Since the conductive layer can be manufactured by the same step as that of the control gate electrode, a nonvolatile semiconductor storage device that is capable of writing with high efficiency at a low voltage and has a favorable electric charge-holding characteristic can be manufactured without forcing manufacturing facilities to a burden.

BRIEF DESCRIPTION OF DRAWINGS

FIG. 6 is a diagram showing an example of an equivalent circuit of a NOR-type nonvolatile memory cell array.

FIGS. 8A and 8B are diagrams each explaining writing operation of a NAND-type nonvolatile memory.

FIGS. 9A and 9B are diagrams respectively explaining erasing operation and reading operation of a NAND-type nonvolatile memory.

FIGS. 20A to 20C are views each showing an example of a manufacturing method of a nonvolatile semiconductor storage device of the present invention.

FIGS. 21A to 21C are views each showing an example of a manufacturing method of a nonvolatile semiconductor storage device of the present invention.

FIGS. 23A and 23B are views each showing a manufacturing method of a nonvolatile semiconductor storage device of the present invention.

DETAILED DESCRIPTION OF THE INVENTION

Figure 1:
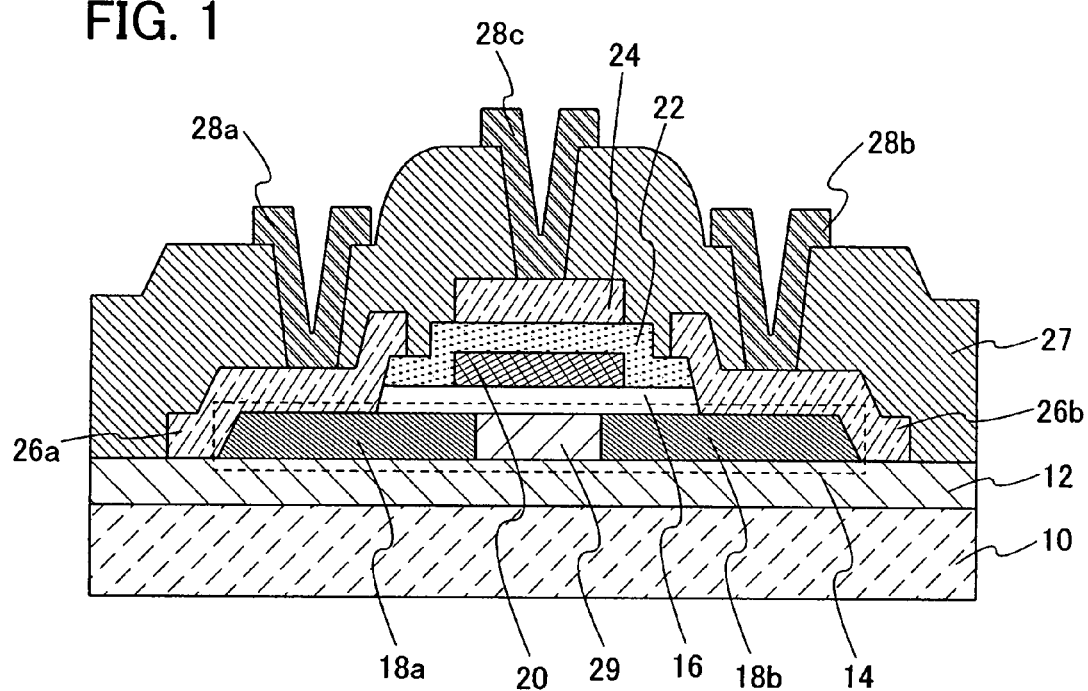
FIG. 1 is a cross-sectional view for explaining a main structure of a nonvolatile semiconductor storage device relating to the present invention.

Embodiment modes of the present invention will be explained below with reference to drawings. However, the present invention is easily understood by those skilled in the art that various changes and modifications are possible, unless such changes and modifications depart from the content and the scope of the present invention. Therefore, the present invention is not construed as being limited to the description of the following embodiment modes. It is to be noted that the same portion may be denoted by the same reference numeral in all the drawings in following structures that are explained in the present invention. It is to be noted that Embodiment Modes 1 to 3 and Embodiments 1 to 3 shown below can be freely combined with each other to be used.

Embodiment Mode 1

FIG. 1 is a cross-sectional view for explaining a main structure of a nonvolatile semiconductor storage device relating to the present invention. FIG. 1 particularly shows a main part of a nonvolatile memory element.

In FIG. 1, reference numeral 10 denotes a substrate; 12, a base insulating film; 14, a semiconductor layer; 29, a channel formation region; 18a and 18b, source or drain regions; 16, a first insulating film (also referred to as a tunnel insulating film); 20, a floating gate electrode; 22, a second insulating film (also referred to as a control insulating film); 24, a control gate electrode; 26a and 26b, conductive layers; 28a and 28b, source or drain electrodes electrically connected to the source region or drain regions 18a and 18b through the conductive layers 26a and 26b; 28c, a gate wiring electrically connected to the control gate electrode; and 27, an insulating film for passivation.

In the structure shown in FIG. 1, the base insulating film 12 is formed over the substrate 10, and the semiconductor layer 14 having the source or drain regions 18a and 18b and the channel formation region 29 is formed over the base insulating film 12. The first insulating film 16 and the conductive layers 26a and 26b are formed over the semiconductor layer 14. The floating gate electrode 20 is formed over the first insulating film 16, the second insulating film 22 is formed over the floating gate electrode 20 and the first insulating film 16, and the control gate electrode 24 is formed over the second insulating film 22. The source or drain electrodes 28a and 28b are electrically connected to the source or drain regions 18a and 18b respectively, through contact holes formed in the insulating film 27. The gate wiring 28c is electrically connected to the control gate electrode 24 through a contact hole formed in the insulating film 27. It is to be noted that the source or drain electrodes 28a and 28b and the source or drain regions 18a and 18b are electrically connected respectively through the conductive layers 26a and 26b. In addition, an insulating film for planarization may be formed over the insulating film 27.

Next, a manufacturing method of the nonvolatile memory element shown in FIG. 1 will be explained.

Figure 2A:
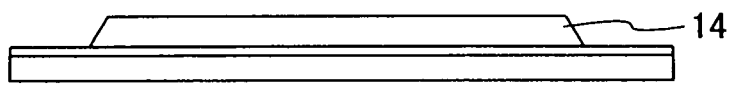
FIGS. 2A to 2D are views each showing an example of a manufacturing method of a nonvolatile semiconductor storage device of the present invention.

First, a semiconductor layer 14 is formed over a substrate 10 having an insulating surface (FIG. 2A). A base insulating film 12 may be provided between the substrate 10 and the semiconductor layer 14 (FIG. 2A). This base insulating film 12 may be appropriately provided as a blocking layer for preventing an impurity such as an alkali metal from diffusing from the substrate 10 into the semiconductor layer 14 and contaminating the semiconductor layer 14.

As the substrate 10 having an insulating surface, a glass substrate, a quartz substrate, a sapphire substrate, a ceramic substrate, a metal substrate having an insulating film over a surface thereof, or the like can be used.

The base insulating film 12 is formed using an insulating material such as silicon oxide, silicon nitride, silicon oxynitride (SiOxNy) (x>y), or silicon nitride oxide (SiNxOy) (x>y) by a CVD method, a sputtering method, or the like. For example, in a case where the base insulating film 12 has a two-layer structure, a silicon nitride oxide film may be formed as an insulating film of a first layer, and a silicon oxynitride film may be formed as an insulating film of a second layer. Alternatively, a silicon nitride film may be formed as an insulating film of a first layer, and a silicon oxide film may be formed as an insulating film of a second layer.

As the semiconductor layer 14, one formed from a single crystalline semiconductor or a polycrystalline semiconductor is preferably used. For example, after a semiconductor layer formed by a sputtering method, a plasma CVD method, or a low pressure CVD method over an entire surface of the substrate 10 is crystallized, the semiconductor layer is selectively etched, thereby forming the semiconductor layer 14. In other words, preferably, an island-shaped semiconductor layer is formed over an insulating surface for element separation, and one or a plurality of nonvolatile memory elements are formed using the semiconductor layer. As a semiconductor material, silicon is preferable, and in addition, a silicon germanium semiconductor can be used. As a crystallization method of the semiconductor layer, a laser crystallization method, a crystallization method by thermal treatment using rapid thermal annealing (RTA) or an annealing furnace, a crystallization method using a metal element promoting crystallization, or a method that is performed by combining these methods can be adopted. Instead of such a thin film process, a so-called SOI (Silicon on Insulator) substrate in which a single crystalline semiconductor layer is formed over an insulating surface may be used.

In such a manner, the semiconductor layer formed over an insulating surface is separately formed to have an island shape, and accordingly, the element can be efficiently separated even when a memory element array and a peripheral circuit are formed over the same substrate. In other words, mutual interference due to a difference in voltages applied to each element can be prevented even when a memory element array that is required to perform writing and erasing at a voltage of greater than or equal to 10 V and less than or equal to 20 V, and a peripheral circuit that mainly controls inputting and outputting data and an instruction by operation at a voltage of greater than or equal to 3 V and less than or equal to 7 V are formed over the same substrate.

Figure 2B:
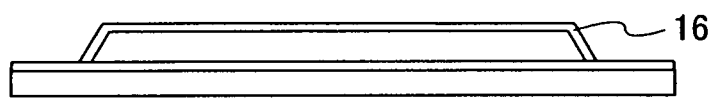

Next, a first insulating film 16 is formed over a surface of the semiconductor layer 14 (FIG. 2B). The first insulating film 16 is formed from silicon oxide or to have a stacked-layer structure of silicon oxide and silicon nitride. The first insulating film 16 may be formed by deposition of an insulating film by a plasma CVD method or a low pressure CVD method; however, the first insulating film 16 is preferably formed by solid-phase oxidation or solid-phase nitriding by plasma treatment. This is because an insulating film that is formed by oxidizing or nitriding a semiconductor layer (typically, a silicon layer) by plasma treatment is dense and has a high dielectric strength voltage and superiority in reliability. Since the first insulating film 16 is used as a tunnel insulating film for injecting electric charges into the floating gate electrode 20, the first insulating film 16 is preferable to have such strength. The first insulating film 16 is preferably formed to have a thickness of greater than or equal to 8 nm and less than or equal to 20 nm, preferably greater than or equal to 8 nm and less than or equal to 10 nm. For example, in a case where a gate length is 600 nm, the first insulating film 16 can be formed to have a thickness of greater than or equal to 8 nm and less than or equal to 10 nm.

As solid-phase oxidation treatment or solid-phase nitriding treatment by plasma treatment, plasma excited by a microwave (typically, 2.45 GHz), in which an electron density is greater than or equal to $1\times10^{11}$ cm$^{-3}$ and less than or equal to $1\times10^{13}$ cm$^{-3}$ and an electron temperature is greater than or equal to 0.5 eV or less than or equal to 1.5 eV, is preferably used. This is because, in the solid-phase oxidation treatment or solid-phase nitriding treatment at a temperature of less than or equal to 500° C., a dense insulating film is formed and a practical response speed is obtained.

In a case where a surface of the semiconductor layer 14 is oxidized by this plasma treatment, the plasma treatment is performed under an oxygen atmosphere. As the oxygen atmosphere, for example, an atmosphere including oxygen ($O_2$) and a rare gas; an atmosphere including dinitrogen monoxide ($N_2O$) and a rare gas; an atmosphere including oxygen, hydrogen ($H_2$), and a rare gas; or an atmosphere including dinitrogen monoxide, hydrogen, and a rare gas is given. As the rare gas, at least one of He, Ne, Ar, Kr, and Xe is included.

In a case where the surface of the semiconductor layer 14 is nitrided by the plasma treatment, the plasma treatment is performed under a nitrogen atmosphere. As the nitrogen atmosphere, for example, an atmosphere including nitrogen ($N_2$) and a rare gas; an atmosphere including nitrogen, hydrogen, and a rare gas; or an atmosphere including $NH_3$ and a rare gas is given. As the rare gas, at least one of He, Ne, Ar, Kr, and Xe is included. In this embodiment mode, as a rare gas, Ar can be used, for example. Further, a gas in which Ar and Kr are mixed may be used.

Figure 4:
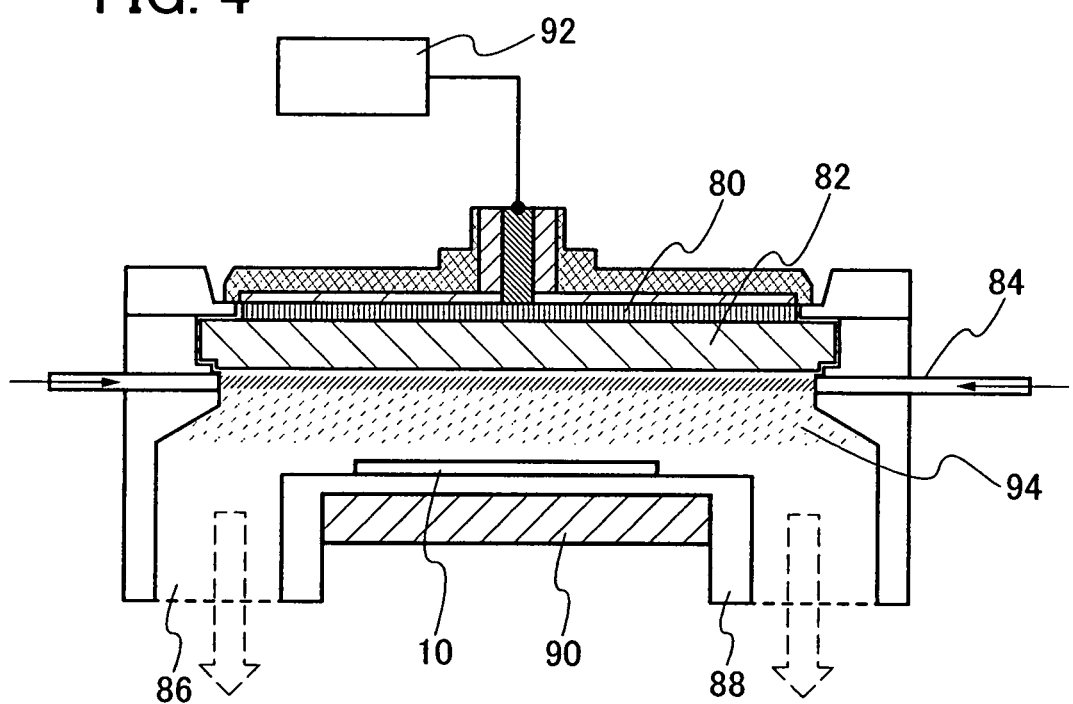
FIG. 4 is a view explaining a structure of a plasma treatment device.

FIG. 4 shows a structural example of a device for performing plasma treatment. This plasma treatment device has a supporting base 88 for arranging the substrate 10, a gas supply portion 84 for introducing a gas, an exhaust port 86 connected to a vacuum pump for exhausting the gas, an antenna 80, a dielectric board 82, and a microwave supply portion 92 for supplying a microwave for plasma generation. In addition, the supporting base 88 is provided with a temperature control portion 90, whereby a temperature of the substrate 10 can be controlled.

Hereinafter, the plasma treatment will be explained. It is to be noted that the plasma treatment includes oxidation treatment, nitriding treatment, oxynitriding treatment, hydrogenation treatment, and surface modifying treatment to a semiconductor layer, an insulating film, and a conductive layer. For the treatment, a gas supplied from the gas supply portion 84 may be selected in accordance with its purpose.

The oxidization treatment or nitriding treatment may be performed as described below. First, a treatment chamber is made vacuum, and a gas for plasma treatment including oxygen or nitrogen is introduced from the gas supply portion 84. The substrate 10 is heated at the room temperature or heated by the temperature control portion 90 at greater than or equal to 100° C. and less than or equal to 550° C. A distance between the substrate 10 and the dielectric board 82 is about greater than or equal to 20 nm and less than or equal to 80 nm (preferably, greater than or equal to 20 nm and less than or equal to 60 nm). Next, a microwave is supplied from the microwave supply portion 92 to the antenna 80. The microwave is introduced from the antenna 80 into the treatment chamber through the dielectric board 82, whereby plasma 94 is generated. When plasma excitation is performed by introduction of the microwave, plasma having a high electron density (greater than or equal to $1\times10^{11}$ cm$^{-3}$) can be generated at a low electron temperature (less than or equal to 3 eV, preferably, less than or equal to 1.5 eV). By an oxygen radical (there is a case where an OH radical is included) and/or a nitrogen radical (there is a case where a NH radical is included) generated by the high density plasma, a surface of the semiconductor layer can be oxidized or nitrided. When a rare gas such as argon is mixed into the gas for plasma treatment, an oxygen radical or a nitrogen radical can be efficiently generated in accordance with excited species of the rare gas. In accordance with this method, with the use of an active radial excited by plasma efficiently, oxidization, nitriding, or oxynitriding by a solid-phase reaction can be performed at a low voltage temperature of less than or equal to 500° C.

In FIG. 2B, one example of the favorable first insulating film 16 formed by plasma treatment is a stacked-layer structure, in which a silicon oxide layer with a thickness of greater than or equal to 8 nm and less than or equal to 10 nm is formed over a surface of the semiconductor layer 14 by plasma treatment under an oxidative atmosphere, and a surface of the silicon oxide layer is processed by nitrogen plasma to form a nitrogen plasma treatment layer under a nitrogen atmosphere. Specifically, a silicon oxide layer with a thickness of greater than or equal to 8 nm and less than or equal to 10 nm is formed over the semiconductor layer 14 by plasma treatment under an oxygen atmosphere. Then, plasma treatment is successively performed under a nitrogen atmosphere, whereby a nitrogen plasma treatment layer having a high nitrogen concentration is provided over a surface of the silicon oxide layer or in the vicinity of the surface thereof. It is to be noted that the surface vicinity is depth of about 0.5 to 1.5 nm from the surface of the silicon oxide layer. For example, by performing plasma treatment under a nitrogen atmosphere, nitrogen is contained at a ratio of 20 to 50 atom % at the depth of about 1 nm from the surface of the silicon oxide layer.

In any cases, when the solid-phase oxidization treatment or solid-phase nitriding treatment by plasma treatment as the above is used, an insulating film can be obtained, which is equivalent to a thermal oxide film that is formed by heating at about greater than or equal to 950° C. and less than or equal to 1050° C., even when a glass substrate of which allowable temperature limit is less than or equal to 700° C. In other words, as for a tunnel insulating film of the nonvolatile memory element, a highly reliable tunnel insulating film can be formed.

Figure 2C:
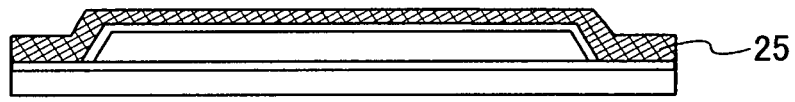
Figure 2D:
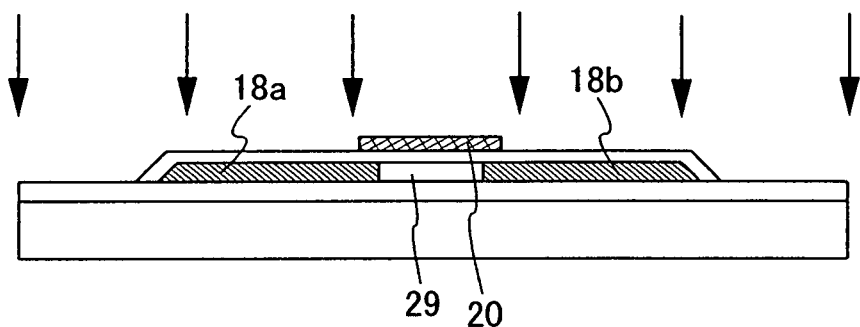

Subsequently, a conductive layer 25 is formed over the first insulating film 16 (FIG. 2C). Then, the conductive layer 25 is selectively etched to form a floating gate electrode 20 over the first insulating film 16 (FIG. 2D). As the floating gate electrode 20, a film made from an element selected from tantalum (Ta), titanium (Ti), molybdenum (Mo), tungsten (W), chromium (Cr), silicon (Si), or germanium (Ge); a film made from nitride of the element (typically, a tantalum nitride film, a tungsten nitride film, or a titanium nitride film); an alloy film in which the above elements are combined (typically, a Mo—W alloy, or a Mo—Ta alloy); or a silicide film of the element (typically, a tungsten silicide film, a titanium silicide film, a nickel silicide film) can be used. An impurity such as phosphorus or boron may be added to the silicon film. The conductive layer may have a single conductive layer or a stacked-layer film with two layers or three layers. The conductive layer is formed by a sputtering method or a CVD method.

It is to be noted that a band gap of a semiconductor material forming the floating gate electrode 20 is preferably smaller than that of the semiconductor layer 14. An energy level at a bottom of a conduction band of the floating gate electrode 20 is made lower than that at a bottom of a conduction band of the semiconductor layer 14, whereby a carrier (electron) injecting property is improved, and an electric charge-holding characteristic is improved.

In addition, the semiconductor material forming the floating gate electrode 20 is preferably formed of a material with lower resistivity than a material forming the semiconductor layer 14. When the floating gate electrode 20 is formed from a semiconductor material with low resistivity and a voltage is applied between the control gate electrode and the semiconductor layer, the applied voltage is not divided in an electric field of the floating gate electrode, and the electric field can be made to effectively operate to the semiconductor layer. For example, germanium is preferable since it has resistivity of 40 to 70 Ω·cm. In order to lower resistivity, an n-type impurity may be added to the floating gate electrode 20. In such a manner, the floating gate electrode 20 is formed from a material with a small band gap and low resistivity as compared with the semiconductor layer 14, whereby a writing characteristic can be improved.

The semiconductor material forming the floating gate electrode 20 is preferably a material in which a barrier energy with respect to electrons of the floating gate electrode 20, which is formed by the first insulating layer 16, becomes higher than a barrier energy with respect to electrons of the semiconductor layer 14, which is formed by the first insulating layer 16. This is because carriers (electrons) from the semiconductor layer 14 to the floating gate electrode 20 are easily injected, and disappearance of electric charges from the floating gate electrode 20 is prevented.

As a material satisfying such a condition, typically, germanium or a germanium compound is used to form the floating gate electrode 20. As a typical example of the germanium compound, silicon germanium is given. In this case, germanium of greater than or equal to 10 atom % with respect to silicon is preferably included. When concentration of germanium is less than or equal to 10 atom %, effect as a structural element fades, and the band gap does not become small effectively.

The floating gate is applied to a nonvolatile semiconductor storage device relating to the present invention for the purpose of accumulating electric charges; however, another semiconductor material can be also applied as long as it has a similar function. For example, a ternary semiconductor including germanium may be used. In addition, the semiconductor material may be hydrogenated. Further, as a material having a function of an electric charge-accumulating layer of a nonvolatile memory element, the semiconductor material can be replaced with an oxide of the germanium or a germanium compound, a nitride of the germanium or a germanium compound, an oxide including the germanium or a germanium compound, or a nitride including the germanium or a germanium compound.

Further, the floating gate electrode 20 may be provided to have a stacked-layer structure of a first floating gate electrode and a second floating gate electrode. In that case, it is preferable that the first floating gate electrode provided on the first insulating layer 16 side be formed from germanium or a germanium compound, and that the second floating gate electrode provided on the second insulating layer 22 side be formed from silicon or a silicon compound. As the silicon compound, silicon nitride, silicon nitride oxide, silicon carbide, silicon germanium including germanium at concentration of less than 10 atom %, metal nitride, metal oxide, or the like can be applied. Silicon or a silicon compound has a larger energy gap than germanium or a germanium compound. In such a manner, the second floating gate electrode is formed from a material having a larger band gap than that of the first floating gate electrode, whereby electric charges accumulated in the floating gate can be prevented from leaking into the second insulating layer 22 side. Further, metal nitride or metal oxide can be used to form the second floating gate electrode. As metal nitride, tantalum nitride, tungsten nitride, molybdenum nitride, titanium nitride, or the like can be used. As metal oxide, tantalum oxide, titanium oxide, tin oxide, or the like can be used.

In any cases, when the above second floating gate electrode made from the silicon or a silicon compound, or metal nitride or metal oxide is provided on an upper layer side of the first floating gate electrode formed from germanium or a germanium compound, the second floating gate electrode can be used as a barrier layer for the purpose of water resistance or chemical resistance in a manufacturing process. Accordingly, a substrate in a photolithography step, an etching step, and a washing step can be handled easily, and productivity can be improved. In other words, the floating gate can be processed easily. However, the materials of the first floating gate electrode and the second floating gate electrode are not limited thereto. The floating gate electrode may have a stacked-layer structure of two or more layers.

Next, an impurity element is introduced into the semiconductor layer 14 using the floating gate electrode 20 as a mask, whereby source or drain regions 18a and 18b are formed (refer to FIG. 2D). As the impurity element, an impurity element imparting n-type conductivity or an impurity element imparting p-type conductivity is used. As the impurity element showing n-type conductivity, phosphorus (P), arsenic (As), or the like can be used. As the impurity element showing p-type conductivity, boron (B), aluminum (Al), gallium (Ga), or the like can be used. For example, in a case of using boron as the p-type impurity, boron is added at concentration of greater than or equal to $5\times10^{15}$ atoms/cm$^3$ and less than or equal to $1\times10^{16}$ atoms/cm$^3$. This is for controlling a threshold voltage of a transistor, and the transistor operates efficiently when boron is added to the channel formation region 29. The channel formation region 29 is formed below a floating gate electrode 20 described below, of which position is between a pair of the source or drain regions 18a and 18b in the semiconductor layer 14.

Figure 3A:
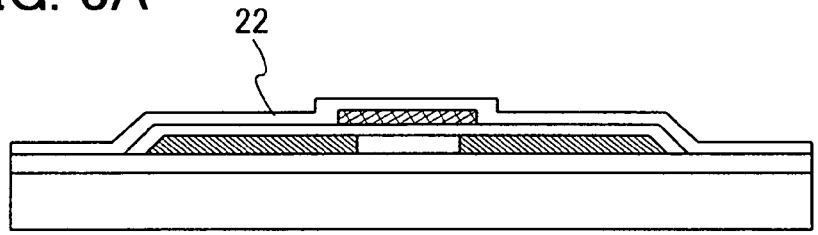
FIGS. 3A to 3E are views each showing an example of a manufacturing method of a nonvolatile semiconductor storage device of the present invention.

Next, a second insulating film 22 is formed over the floating gate electrode 20 (FIG. 3A). The second insulating film 22 is formed by a low pressure CVD method, a plasma CVD method, or the like to have one layer or plural layers formed from silicon oxide, silicon oxynitride (SiOxNy) (x>y), silicon nitride (SiNx), silicon nitride oxide (SiNxOy) (x>y), aluminum oxide (AlxOy), HfOx, TaOx, or the like. The second insulating film 22 is formed to have a thickness of greater than or equal to 20 nm and less than or equal to 60 nm, preferably greater than or equal to 30 nm and less than or equal to 40 nm. For example, a stacked-layer film can be used, in which a silicon oxide layer with a thickness of 8 nm is formed, a silicon nitride layer with a thickness of 2 nm is formed thereover, and a silicon oxynitride film with a thickness of 30 nm is formed thereover. In addition, plasma treatment may be performed to the floating gate electrode 20, and a surface thereof may be subjected to nitriding treatment, whereby a nitride film may be formed. In any cases, when one of or both the first insulating film 16 and the second insulating film 22 have a nitride film or a layer that is subjected to nitriding treatment on a side in contact with the floating gate electrode 20, oxidization of the floating gate 20 can be prevented.

Figure 3B:
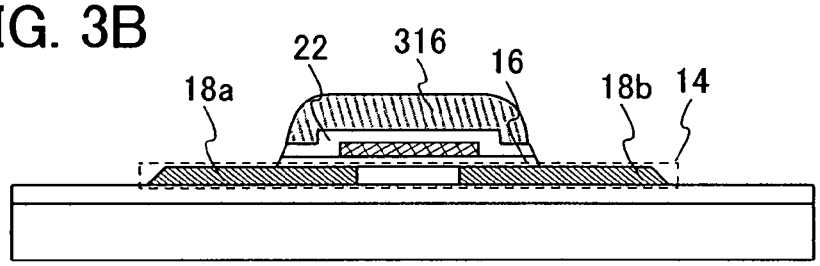

Then, the first insulating film 16 and the second insulating film 22 are selectively etched and removed so that a part of the surface of the source or drain regions 18a and 18b is exposed (FIG. 3B). A resist 316 is formed over the semiconductor layer 14 so as to cover the above portion of the floating gate electrode 20 and a part of the source or drain regions 18a and 18b. Thereafter, the first insulating film 16 and the second insulating film 22 are removed so as to expose the part of the source or drain regions 18a and 18b by etching.

Figure 3C:
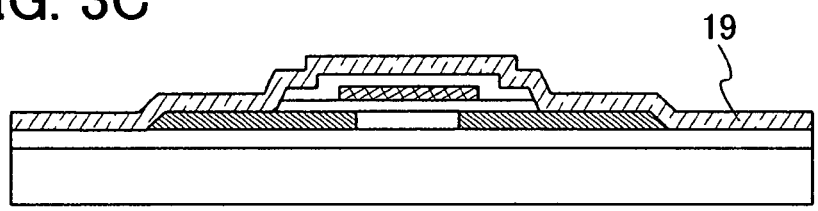
Figure 3D:
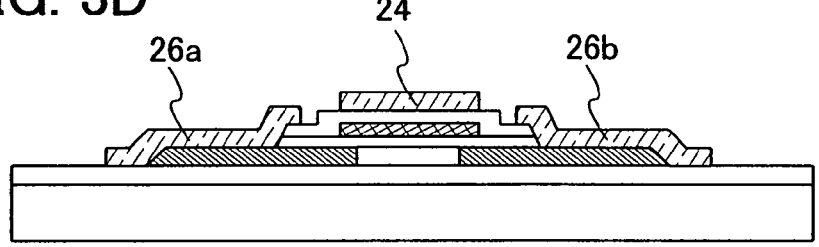

Subsequently, a conductive layer 19 is formed over the second insulating film 22 and the source or drain regions 18a and 18b (FIG. 3C). The conductive layer 19 is selectively etched and removed so as to remain partly at the above portion of the semiconductor layer 14. Thus, a control gate electrode 24 is formed over the channel formation region 29, and first conductive layers 26a and 26b are formed over the source or drain regions 18a and 18b (FIG. 3D). The control gate electrode 24 and the first conductive layers 26a and 26b are preferably formed from a metal selected from tantalum (Ta), tungsten (W), titanium (Ti), molybdenum (Mo), chromium (Cr), niobium (Nb), or the like, or an alloy material or a compound material containing the metal as its main component. Further, polycrystalline silicon to which an impurity element such as phosphorus is added may be used. Furthermore, the control gate electrode 24 may be formed to have one layer or a stacked-layer structure including plural layers of a metal nitride layer 24a and a metal layer 24b using the above metal. As metal nitride, tungsten nitride, molybdenum nitride, or titanium nitride can be used. By providing the metal nitride layer 24a, adhesiveness of the metal layer 24b can be improved, and peeling can be prevented. Since metal nitride such as tantalum nitride has high work function, a thickness of the first insulating film 16 can be increased by the synergistic effect with the second insulating film 22. It is to be noted that the conductive layers 26a and 26b may be formed to cover a part of the first insulating film 16 or the second insulating film 22.

Figure 3E:
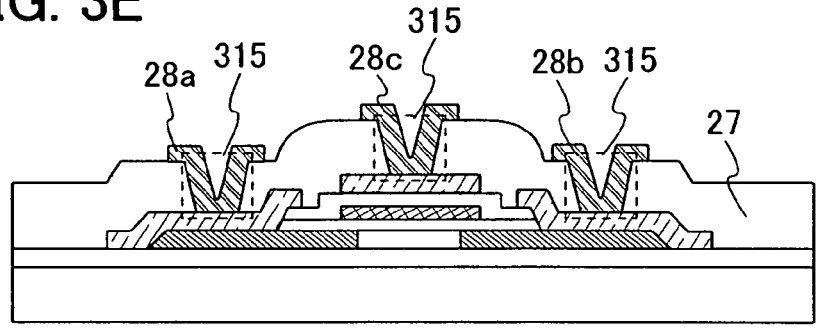

Then, a third insulating film 27 having contact holes 315 is formed over the control gate electrode 24 and the first conductive layers 26a and 26b (FIG. 3E). The third insulating film 27 can be provided by a CVD method, a sputtering method, or the like to have a single layer of an insulating film including oxygen or nitrogen such as a silicon oxide (SiO$_X$) film, a silicon nitride (SiN$_X$) film, a silicon oxynitride (SiO$_X$N$_Y$) (x>y) film, or a silicon nitride oxide (SiN$_X$O$_Y$) (x>y) film, a film including carbon such as a DLC (diamond like carbon) film, an organic material such as epoxy, polyimide, polyamide, polyvinyl phenol, benzocyclobutene, or acrylic, or a siloxane material such as a siloxane resin; or a stacked-layer structure thereof. It is to be noted that the siloxane material corresponds to a material having Si—O—Si bonds. Siloxane has a skeleton structure of a bond of silicon (Si) and oxygen (O). As a substituent, an organic group including at least hydrogen (for example, an alkyl group or aromatic hydrocarbon) is used. As a substituent, a fluoro group can also be used. Alternatively, an organic group including at least hydrogen and a fluoro group may be used as a substituent.

The contact holes 315 are formed so that part of the conductive layers 26a and 26b are exposed by forming a resist mask over the third insulating film 27 and performing dry etching. In this embodiment mode, the conductive layers 26a and 26b are provided over the source or drain regions 18a and 18b; accordingly, etching is not performed up to the semiconductor layer serving as the source or drain regions in a case of etching for forming the contact holes 315.

Next, source or drain electrodes (second conductive layers) 28a and 28b are formed so as to be in contact with the first conductive layers 26a and 26b respectively through the contact holes formed in the third insulating film 27 (FIG. 3E). In addition, a gate wiring 28c is formed so as to be in contact with the control gate electrode 24. The source or drain regions 18a and 18b are electrically connected to the source or drain electrodes 28a and 28b through the first conductive layers 26a and 26b, respectively. As the source or drain electrodes 28a and 28b and the gate wiring 28c, a single layer or a stacked-layer film is formed by a CVD method, a sputtering method, or the like, from a element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the element as its main component. Then, the single layer or the stacked-layer film is etched to form the source or drain electrodes 28a and 28b and the gate wiring 28c. The alloy material containing aluminum as its main component corresponds to, for example, a material containing aluminum as its main component and nickel, or an alloy material containing aluminum as its main component, nickel, and one of or both carbon and silicon.

The source or drain electrodes 28a and 28b may have, for example, a stacked-layer structure of a barrier film, an aluminum silicon (Al—Si) film, and a barrier film, or a stacked-layer structure of a barrier film, an aluminum silicon (Al—Si) film, a titanium nitride (TiN) film, and a barrier film. It is to be noted that the barrier film corresponds to a thin film of titanium, nitride of titanium, molybdenum, or nitride of molybdenum. Aluminum and aluminum silicon have a low resistance value and are inexpensive, which are optimum for a material of the source or drain electrodes 28a and 28b. When upper and lower barrier layers are provided, generation of a hillock of aluminum or aluminum silicon can be prevented. By forming the barrier film of titanium that is an element having a high reducing property, even when a thin natural oxide film is formed over a crystalline semiconductor layer, the natural oxide film can be reduced, so that favorable contact with the crystalline semiconductor layer can be formed.

In a nonvolatile memory element having the structure as shown in FIG. 1, the conductive layers 26a and 26b are provided between the source or drain regions 18a and 18b and the source or drain electrodes 28a and 28b. Therefore, when the third insulating film 27 is etched, etching is not performed up to the semiconductor layer, and increase in a contact resistance value can be prevented. Accordingly, a memory that is capable of writing with high efficiency at a low voltage and has a favorable electric charge-holding characteristic can be manufactured.

Figure 5:
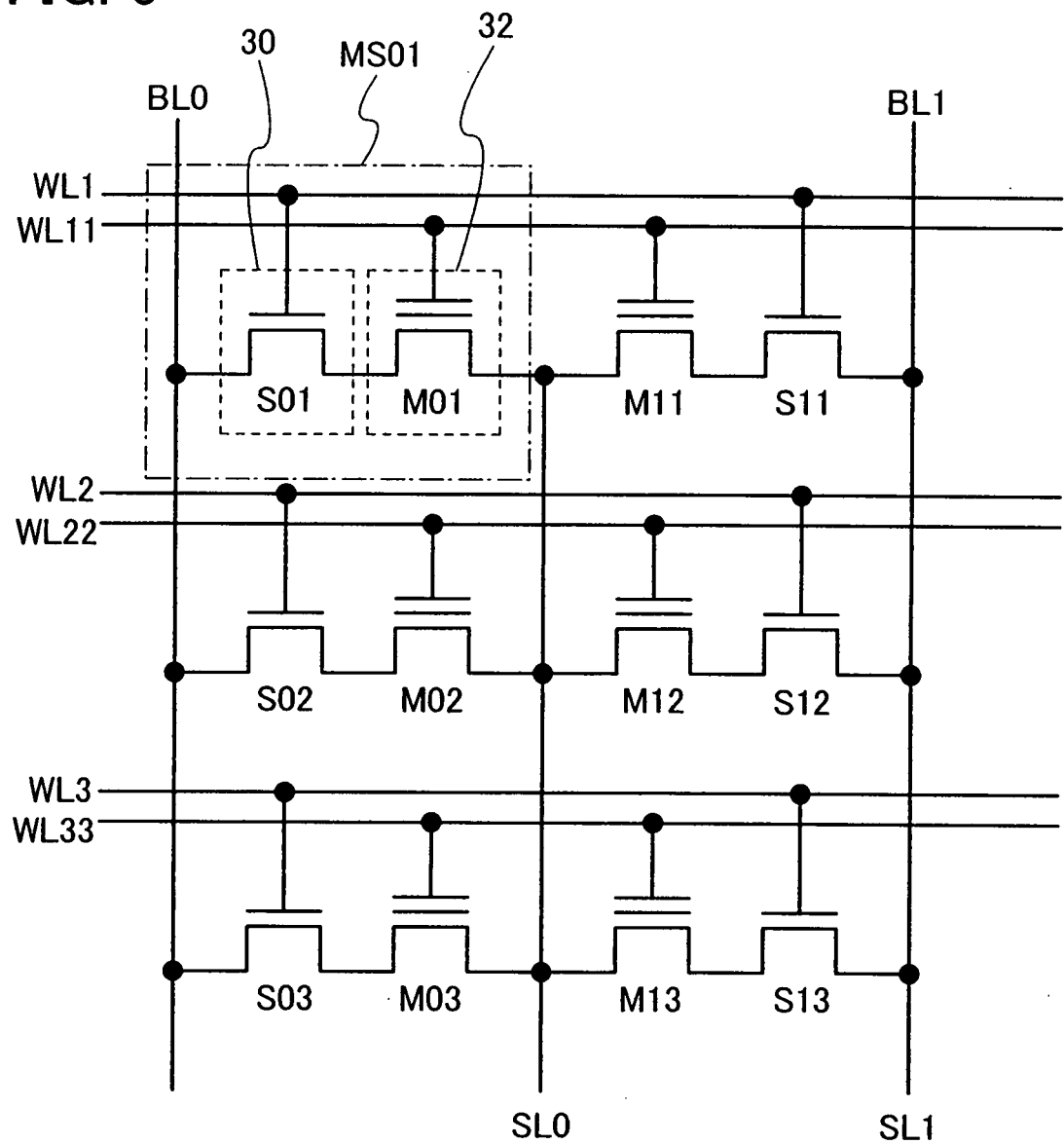
FIG. 5 is a diagram showing an example of an equivalent circuit of a nonvolatile memory cell array.

With the use of such a nonvolatile memory element, various types of nonvolatile semiconductor storage devices can be obtained. FIG. 5 shows an example of an equivalent circuit of a nonvolatile memory cell array. A memory cell MS01 storing information of 1 bit includes a selection transistor S01 and a nonvolatile memory element M01. The nonvolatile memory element M01 is a memory element having the structure shown in FIG. 1. In FIG. 5, each nonvolatile memory element M01 to M03, and M11 to M13 has the structure shown in FIG. 1. The nonvolatile memory elements M01 to M03 and M11 to M13 are respectively controlled by selection transistors S01 to S03 and S11 to S13. The number of the nonvolatile memory elements or the selection transistors is not limited to one shown in FIG. 5.

The selection transistor S01 is inserted between a bit line BL0 and the nonvolatile memory element M01 in series, and a gate thereof is connected to a word line WL1. A gate of the nonvolatile memory element M01 is connected to a word line WL11. When data is written to the nonvolatile memory element M01, a high voltage is applied to the word line WL11 under the condition that an H level is applied to the word line WL1 and the bit line BL0 and a L level is applied to a bit line BL1. As a result, electric charges are accumulated in the floating gate, and data can be written to the nonvolatile memory element. When the data is erased, a high voltage of negative polarity is applied to the word line WL11 under the condition that an H level is applied to the word line WL1 and the bit line BL0.

In this memory cell MS01, the selection transistor S01 and the nonvolatile memory element M01 are respectively formed using semiconductor layers 30 and 32 that are separately formed into an island shape over an insulating surface, whereby interference from other selection transistors or nonvolatile memory elements can be prevented without providing an element separation region specifically. Further, both the selection transistor S01 and the nonvolatile memory element M01 in the memory cell MS01 are n-channel type. Therefore, both the selection transistor S01 and the nonvolatile memory element M01 are formed in one semiconductor layer that is separated to have an island shape, whereby a wiring connecting these two elements can be omitted.

FIG. 6 shows a NOR type equivalent circuit in which a nonvolatile memory element is directly connected to a bit line. A memory cell array is provided so that a word line WL and a bit line BL are intersected with each other, and nonvolatile memory elements are arranged in each intersection point. In the NOR type, a drain of each nonvolatile memory element is connected to the bit line BL. A source of each nonvolatile memory element is connected to a source line SL in common.

Also, in this case, in a memory cell MS01, a nonvolatile memory element M01 is formed using a semiconductor layer 32 that is separately formed into an island shape over an insulating surface, whereby interference from other nonvolatile memory elements can be prevented without providing an element separation region, specifically. Further, a plurality of nonvolatile memory elements (for example, nonvolatile memory elements M01 to M23 shown in FIG. 6) is recognized as one block, and these nonvolatile memory elements are formed using one semiconductor layer that is separated to have an island-shaped, whereby erasing operation can be performed by block units.

The NOR type operates, for example, as follows. When data is written, a high voltage is applied to a word line WL that is selected for writing data under the condition that the source line SL is set to be 0V, and potential corresponding to data "0" and data "1" is applied to the bit line BL. For example, potential of an H level and a L level with respect to "0" and "1" are each given to the bit line BL. In the nonvolatile memory element to which an H level is applied in order to write "0" data, hot electrons are generated in the vicinity of the drain, and the hot electrons are injected to the floating gate. In the case of "1" data, such an electron injection is not generated.

In the memory cell given "0" data, hot electrons are generated in the vicinity of the drain by a strong electric field in a horizontal direction between the drain and the source, and the hot electrons are injected to the floating gate. From this, a state in which a threshold voltage becomes high by injection of the electrons to the floating gate is "0". In the case of "1" data, hot electrons are not generated, and a state in which a threshold voltage is low without injection of the electrons to the floating gate, that is, an erasing state, is held.

When data is erased, a positive voltage of about 10 V is applied to the source line SL, and the bit line BL is kept to be a floating state. Then, a high voltage of negative polarity is applied to the word line (a high voltage of negative polarity is applied to the control gate), and electrons are drawn from the floating gate. From this, an erasing state of data "1" is obtained.

Reading data is performed as follows: the source line SL is set to be 0 V, and the bit line BL is set to be about 0.8 V; a reading voltage that is set to be an intermediate value of a threshold value of data "0" and "1" is applied to the selected word line WL; and whether or not the current draw of the nonvolatile memory element exists is determined by a sense amplifier connected to the bit line BL.

Figure 7:
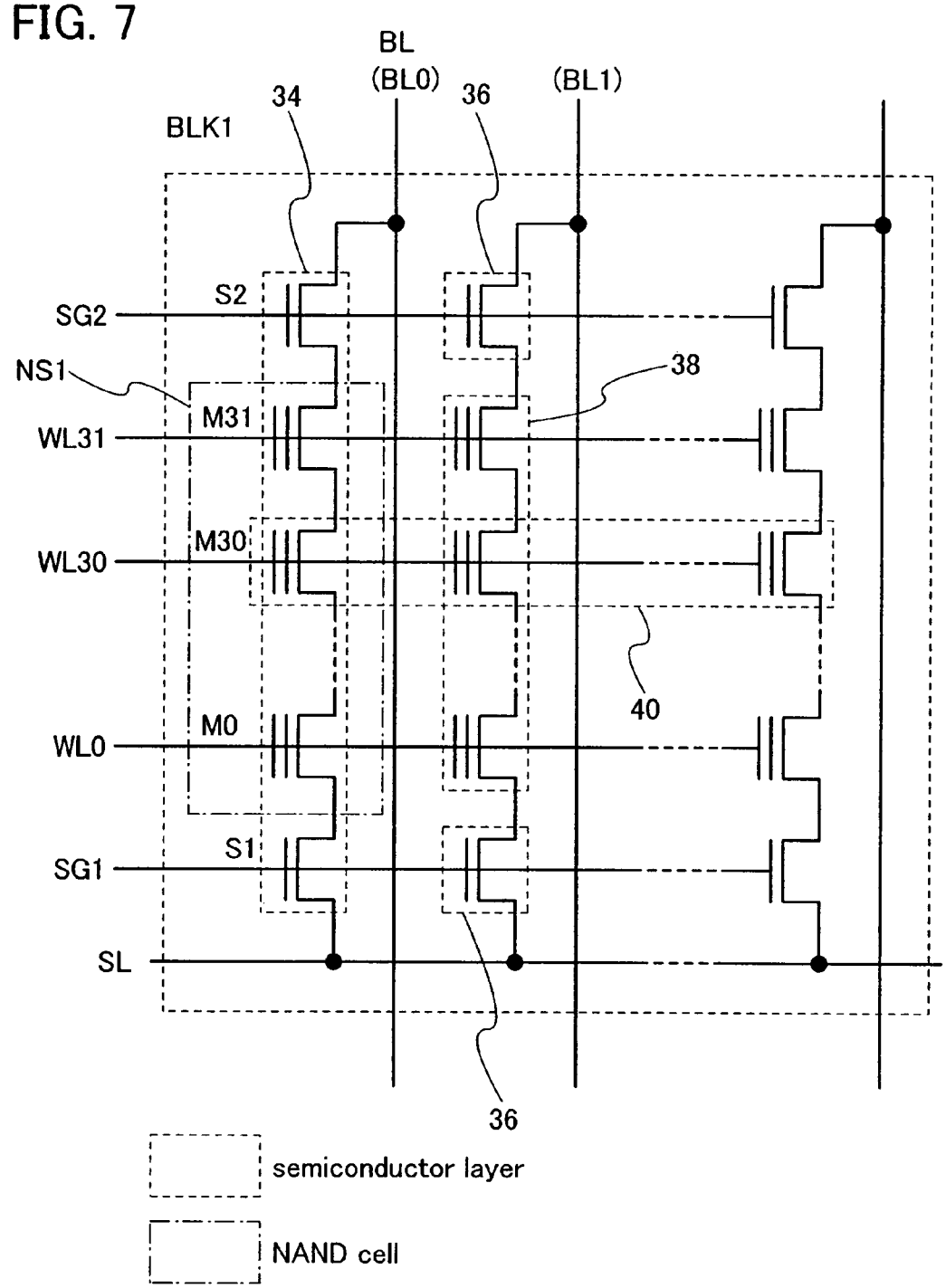
FIG. 7 is a diagram showing an example of an equivalent circuit of a NAND-type nonvolatile memory cell array.

FIG. 7 shows an equivalent circuit of a NAND type memory cell array. A NAND cell NS1 in which a plurality of nonvolatile memory elements is connected in series is connected to a bit line BL. A block BLK includes a plurality of NAND cells. There are 32 word lines (word lines WL0 to WL31) of a block BLK1 shown in FIG. 7. Nonvolatile memory elements positioned in the same row of the block BLK1 are connected to word lines corresponding to this row in common.

In this case, selection transistors S1 and S2 and nonvolatile memory elements M0 to M31 are connected in series. These selection transistors and the nonvolatile memory elements may be recognized as one unit and formed using one semiconductor layer 34 in common. Accordingly, a wiring connecting the nonvolatile memory elements can be omitted, and integration can be attempted. Further, separation from an adjacent NAND cell can be easily performed. Semiconductor layers 36 of the selection transistors S1 and S2 and a semiconductor layer 38 of the NAND cell may be separately formed. When erasing operation in which electric charges are drawn from each floating gate of the nonvolatile memory elements M0 to M31 is performed, the erasing operation can be performed by a unit of the NAND cell. Further, nonvolatile memory elements connected to one word line (for example, nonvolatile memory elements in a row of M30) in common may be formed using one semiconductor layer 40.

Writing operation is implemented after the NAND cell NS1 is in an erasing state, that is, a threshold value of each nonvolatile memory element of the NAND cell NS1 is in a negative voltage state. Writing is sequentially performed from the memory element M0 on a source line SL side. In a case where writing to the memory element M0 is explained as an example, the outline of writing operation is shown as below.

In FIG. 8A, when "0" writing is conducted, Vcc (a power supply voltage), for example, is applied to a select gate line SG2 to turn on a selection transistor S2, and concurrently, a bit line BL0 is set to be in 0 V (a ground voltage). A select gate line SG1 is set to be in 0 V, and the selection transistor S1 is turned off. Next, a high voltage Vpgm (about 20 V) is applied to a word line WL0 of a memory cell MS0 and an intermediate voltage Vpass (about 10 V) are applied to other word lines. Since a voltage of the bit line BL is 0 V, potential of a channel formation region of the selected memory cell MS0 becomes 0 V. A potential difference between the word line WL0 and the channel formation region is large, and therefore, electrons are injected to a floating gate of the memory cell MS0 by F-N tunnel current as described above. From this, a threshold voltage of the memory cell MS0 becomes a positive state (a state in which "0" is written).

On the other hand, when "1" writing is conducted, Vcc (a power supply voltage), for example, is applied to a bit line BL as shown in FIG. 8B. Since a voltage of a select gate line SG2 is Vcc, when the voltage becomes Vcc minus Vth (Vcc-Vth) with respect to a threshold voltage Vth of a selection transistor S2, the selection transistor S2 is cut off. Accordingly, a channel formation region of a memory cell MS0 becomes a floating state. Next, when a high voltage Vpgm (20 V) is applied to a word line WL0 and an intermediate voltage Vpass (10 V) is applied to other word lines, a voltage of the channel formation region is increased from Vcc-Vth to, for example, about 8 V by capacity coupling of each word line and channel formation region. Since the voltage of the channel formation region is boosted to the high voltage, a potential difference between the word line WL0 and the channel formation region is small, which is different from the case of the "0" writing. Accordingly, electron injection by F-N tunnel current is not generated in the floating gate of the memory cell MS0. Therefore, a threshold value of a memory cell MS1 is kept in a negative state (a state in which "1" is written).

When erasing operation is conducted, a high voltage of negative polarity (Vers) is applied to all word lines in a selected block as shown in FIG. 9A. A bit line BL and a source line SL are to be in a floating state. From this, electrons in a floating gate in all memory cells of the block are discharged to a semiconductor layer by a tunnel current. As a result, a threshold voltage of these memory cells is shifted to a negative direction.

In reading operation shown in FIG. 9B, a voltage Vr (for example, 0V) is applied to a word line WL0 of a memory cell MS0 in which reading is selected, and an intermediate voltage Vread for reading is applied to word lines WL1 to WL31 of non-selected memory cells and select gate lines SG1 and SG2, which is a little higher than a power supply voltage. In other words, the memory elements other than the select memory element serve as a transfer transistor as shown in FIGS. 9A and 9B. From this, whether or not a current flows in the memory cell MS0 in which reading is selected is detected. That is, in a case where data stored in the memory cell MS0 is "0", the memory cell MS0 is turned off, and a bit line BL does not discharge. On the other hand, in a case where data is "1", the memory cell MS0 is turned on, and the bit line BL discharges.

Figure 10:
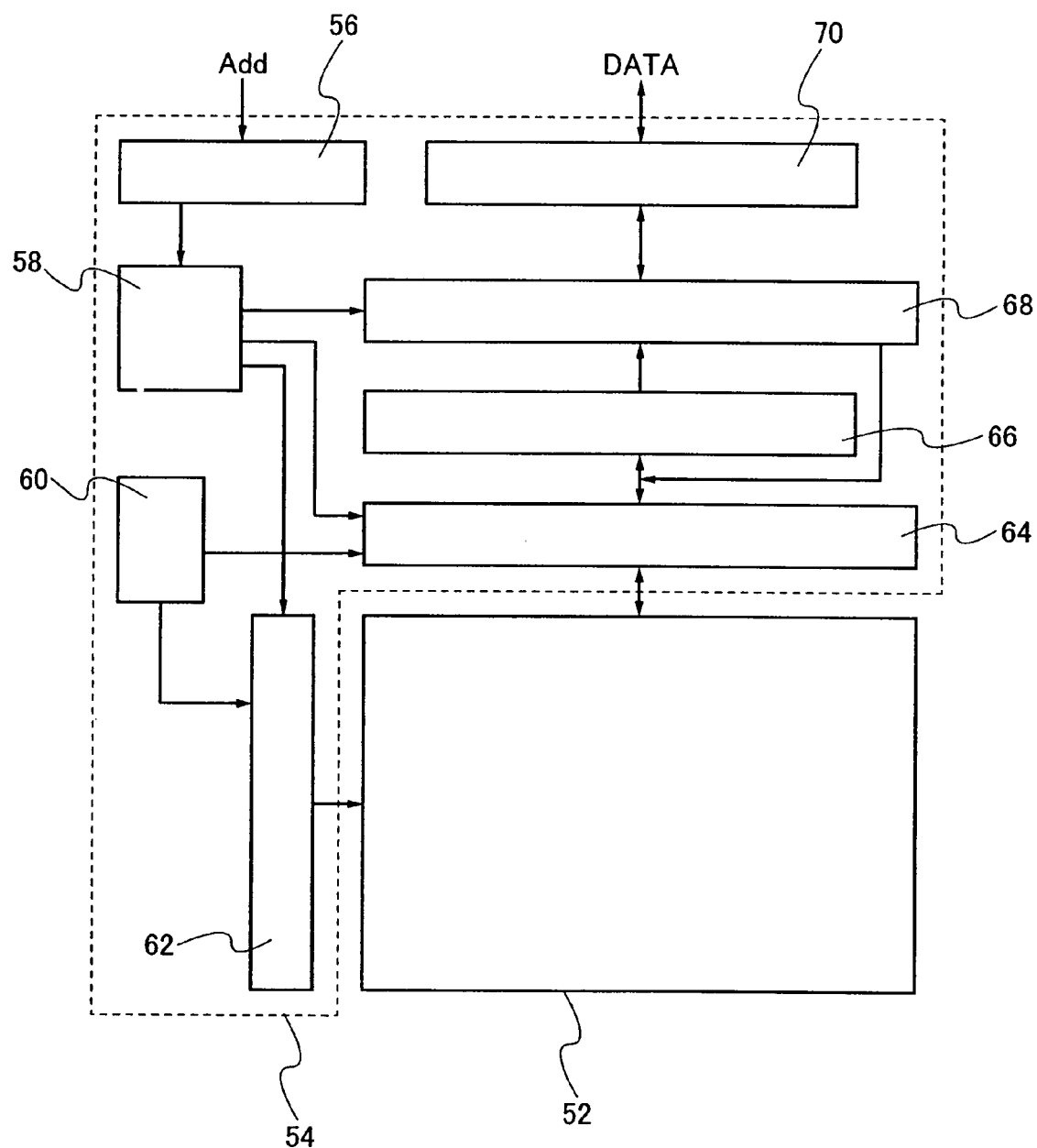
FIG. 10 is a diagram showing an example of a circuit block diagram of a nonvolatile semiconductor storage device.

FIG. 10 shows an example of a circuit block diagram of a nonvolatile semiconductor storage device. In the nonvolatile semiconductor storage device, a memory cell array 52 and a peripheral circuit 54 are formed over the same substrate. The memory cell array 52 has a structure as shown in FIG. 5, FIG. 6, or FIG. 7. The peripheral circuit 54 has a structure described as below.

A row decoder 62 for selecting a word line and a column decoder 64 for selecting a bit line are provided on the periphery of the memory cell array 52. An address is transferred to a control circuit 58 through an address buffer 56, and an internal row address signal and an internal column address signal are respectively transferred to the row decoder 62 and the column decoder 64.

For writing and erasing data, a voltage that boosts a power supply voltage is used. Therefore, a boosting circuit 60 that is controlled corresponding to an operation mode by the control circuit 58 is provided. Output of the boosting circuit 60 is supplied to a word line WL or a bit line BL through the row decoder 62 and the column decoder 64. In a sense amplifier 66, data that is output from the column decoder 64 is input. Data that is read by the sense amplifier 66 is held in a data buffer 68, accessed at random by control from the control circuit 58, and output through a data input/output buffer 70. Writing data is once held in the data buffer 68 through the data input/output buffer 70 and transferred to the column decoder 64 by control of the control circuit 58.

As described above, in the memory cell array 52 of the nonvolatile semiconductor storage device, potential that is different from power supply potential is necessary to be used. Therefore, it is desirable that at least an interval between the memory cell array 52 and the peripheral circuit 54 be electrically insulated. In this case, a nonvolatile memory element and a transistor of a peripheral circuit are formed using a semiconductor layer that is formed over an insulating surface as explained in embodiments below, whereby insulation can be easily performed. Accordingly, a nonvolatile semiconductor storage device with low power consumption, in which malfunction is reduced, can be obtained.

Embodiment Mode 2

In this embodiment mode, a manufacturing method of a nonvolatile memory element that has a different structure from that of the nonvolatile memory element shown in FIG. 1 will be explained. In this embodiment mode, a nonvolatile memory element shown in FIG. 11 will be explained. In the nonvolatile memory element shown in FIG. 11, a control gate electrode 24 is provided with sidewalls 300.

Figure 11:
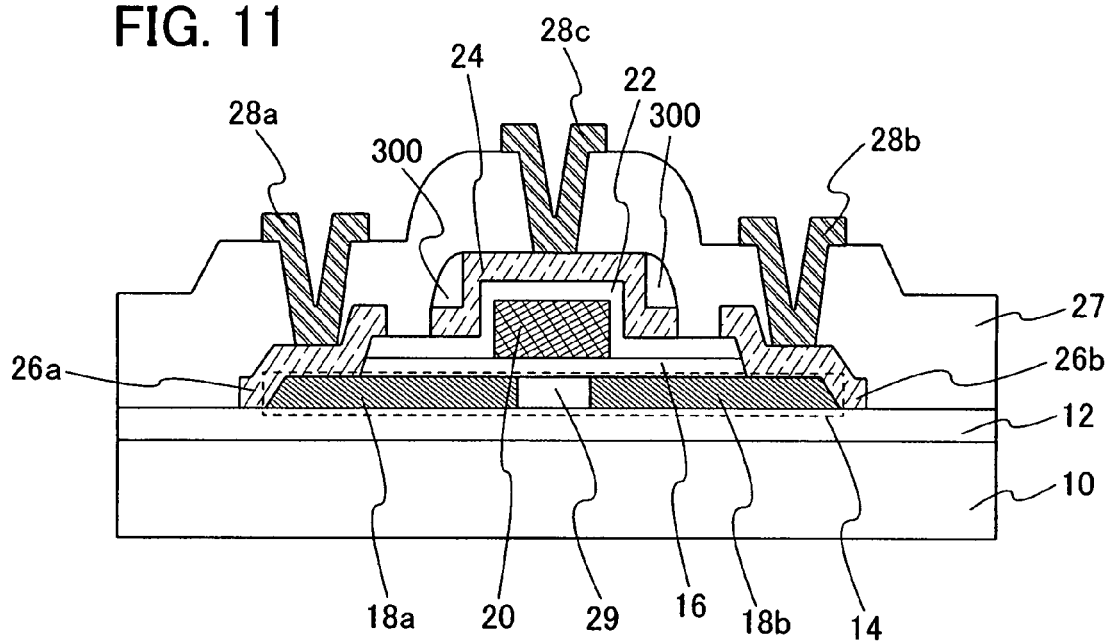
FIG. 11 is a cross-sectional view for explaining a main structure of a nonvolatile semiconductor storage device relating to the present invention.

In FIG. 11, reference numeral 10 denotes a substrate; 12, a base insulating film; 14, semiconductor layer; 29, a channel formation region; 18a and 18b, source or drain regions; 16, a first insulating film (also referred to as a tunnel insulating film); 20, a floating gate electrode; 22, a second insulating film (also referred to as a control insulating film); 24, a control gate electrode; 300, a sidewall; 26a and 26b, conductive layers; 28a and 28b, source or drain electrodes electrically connected to the source or drain regions 18a and 18b through the conductive layers 26a and 26b; 28c, a gate wiring electrically connected to the control gate electrode; and 27, an insulating film for passivation.

As a structure shown in FIG. 11, the base insulating film 12 is formed over the substrate 10, and the semiconductor layer 14 having the source or drain regions 18a and 18b and the channel formation region 29 is formed over the base insulating film 12. The first insulating film 16 and the conductive layers 26a and 26b are formed over the semiconductor layer 14, the floating gate electrode 20 is formed over the first insulating film 16, and the second insulating film 22 is formed over the floating gate electrode 20 and the first insulating film 16. The control gate electrode 24 is formed over the second insulating film 22. The control gate electrode 24 is provided with the sidewalls 300. In addition, the insulating film 27 is formed over the second insulating film 22, the control gate electrode 24, and the sidewalls 300. The source or drain electrodes 28a and 28b are electrically connected to the source or drain regions 18a and 18b respectively through the insulating film 27 and the conductive layers 26a and 26b. The gate wiring 28c is electrically connected to the control gate electrode 24 through a contact hole formed in the insulating film 27. It is to be noted that the source or drain electrodes 28a and 28b and the source or drain regions 18a and 18b are electrically connected to each other through the conductive layers 26a and 26b. An insulating film for planarization may be formed over the insulating film 27.

Next, a manufacturing method of the nonvolatile memory element shown in FIG. 11 will be explained with reference to FIGS. 12A to 12E. Steps up to the formation of a conductive layer 19 over the second insulating film 22 and the source or drain regions 18a and 18b are similar to the steps up to FIG. 3C in Embodiment Mode 1; therefore, explanation thereof is omitted.

Figure 12A:
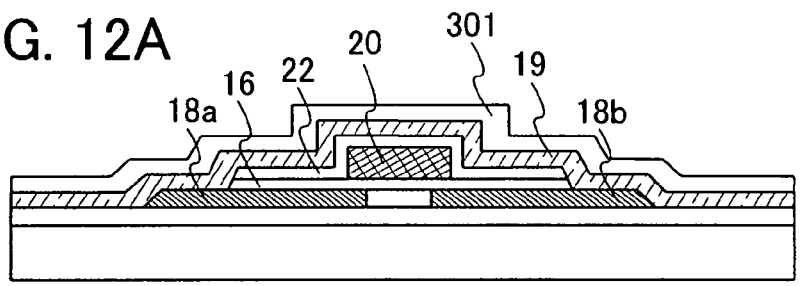
FIGS. 12A to 12E are views each showing an example of a manufacturing method of a nonvolatile semiconductor storage device of the present invention.

After the conductive layer 19 is formed over the second insulating film 22 and the source or drain regions 18a and 18b, an insulating film 301 for forming the sidewalls 300 is formed over the conductive layer 19 (FIG. 12A). As the insulating film 301, a silicon oxide film, a silicon oxynitride film, a silicon nitride oxide film, or the like can be used. Instead of the insulating film, a conductive layer such as a tantalum (Ta) film, a titanium (Ti) film, a molybdenum (Mo) film, or a tungsten (W) film may be used. Any kinds of film can be used as long as it can take an etching selection ratio in etching of the control gate electrode and has an isotropic coverage with respect to a step shape. Further, the film may be a single layer or stacked-layer film.

Figure 12B:
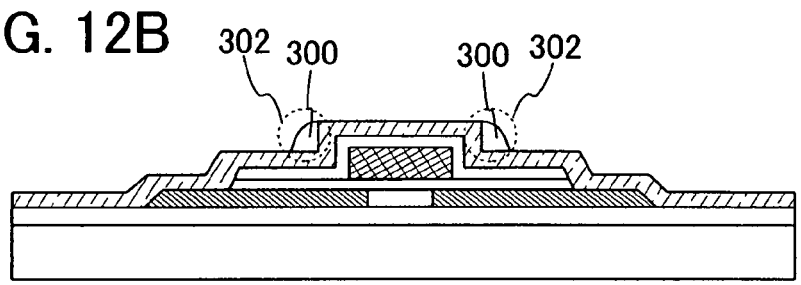

Thereafter, anisotropic etching is performed with respect to the insulating film 301. As the result, the sidewalls 300 are formed in a self-aligned manner in step portions 302 generated in the conductive layer 19 due to the existence of the floating gate electrode 20 (FIG. 12B). The sidewalls 300 formed in the step portions 302 are formed in a symmetric place or an approximately symmetric place by setting the floating gate electrode 20 as a center. Both sidewalls 300 are formed in places each of which has the same distance or the approximately same distance from an edge portion of the floating gate electrode 20 in a gate length direction.

Figure 12C:
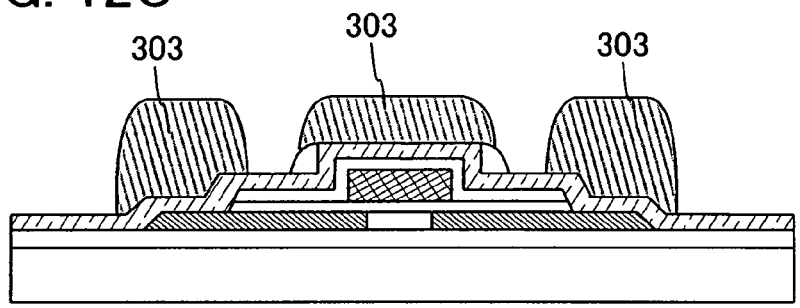
Figure 12D:
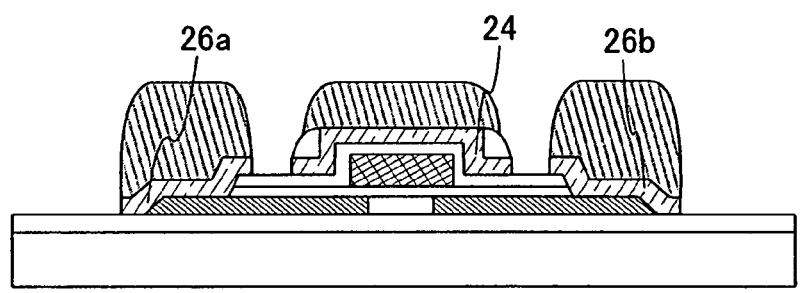

Next, resist masks 303 are formed over the conductive layer 19 (FIG. 12C). The conductive layer 19 is etched using the resist masks 303 and the sidewalls 300 as a mask, whereby a control gate electrode 24 can be formed in a self-aligned manner with respect to the floating gate electrode 20 (FIG. 12D). In addition, conductive layers 26a and 26b can be formed. Then, the resist masks 303 are removed.

Figure 12E:
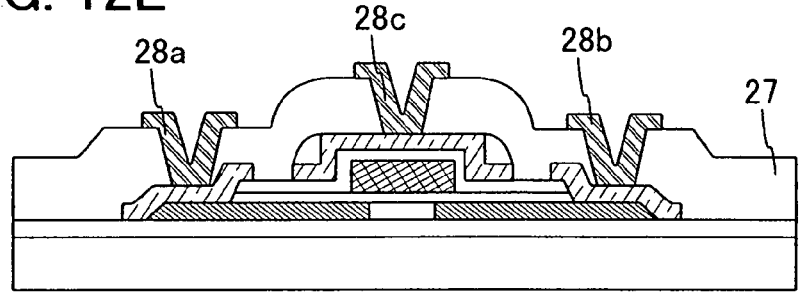

Subsequently, an insulating film 27 is formed over an entire surface including the second insulating film 22, the conductive layers 26a and 26b, the control gate electrode 24, and the sidewalls 300, and then hydrogenation is performed (FIG. 12E). As the insulating film 27, a silicon nitride film, a silicon oxynitride film, or silicon nitride oxide film can be used. In a case where aforementioned activation or the like is not performed, thermal treatment, light irradiation by laser light, intense light, or the like, RTA treatment, or the like may be implemented for activation of the source region and the drain region in this step.

Then, a resist mask is formed over the insulating film 27, and the insulating film 27 is etched using this resist mask to form contact holes positioned over the source or drain regions 18a and 18b and the control gate electrode 24.

After the resist mask is removed and a conductive layer is formed, etching is performed using another resist mask to form source or drain electrodes 28a and 28b, a gate wiring 28c, and other wirings (such as a source wiring) (FIG. 12E). Here, the electrode and the wiring are formed in an integrated manner; however, the electrode and the wiring may be separately formed to be electrically connected to each other. As the conductive layer, a Ti film, a TiN film, an Al film, an Al alloy film, or a stacked-layer film in which the above films are combined can be used.

Here, the electrode and wiring are preferably led so that a corner thereof has a round shape in a case of seeing the substrate 10 from a vertical direction (that is, from a top view direction). When the corner is made to have a round shape, dust or the like can be prevented from remaining in the corner of the wiring. Therefore, a defect cased by dust is suppressed, and the yield can be improved.

In the above manufacturing method, an n-type or p-type impurity is only once added when forming the source or drain regions 18a and 18b. However, the addition may be performed in plural times to provide a low concentration impurity region (LDD region). Hereinafter, a manufacturing method of a structure provided with the low concentration impurity region will be explained.

Figure 13A:
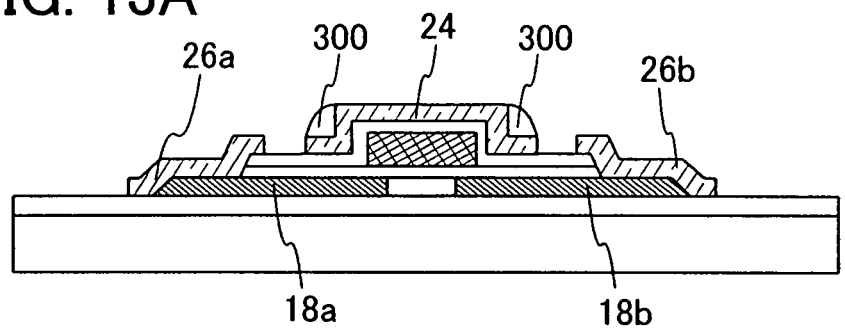
FIGS. 13A to 13C are views each showing an example of a manufacturing method of a nonvolatile semiconductor storage device of the present invention.
Figure 13B:
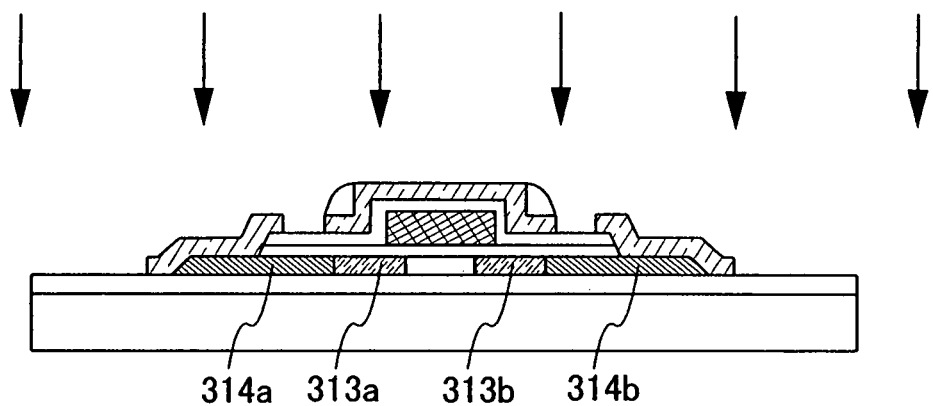

After the structure shown in FIG. 12C is formed, the resist masks are removed to obtain a structure having the source or drain regions 18a and 18b, the sidewalls 300, the control gate electrode 24, the conductive layers 26a and 26b, and the like as shown in FIG. 13A. Next, an n-type or p-type impurity is added to the semiconductor layer having the source or drain regions 18a and 18b (FIG. 13B). As the n-type or p-type impurity, an impurity imparting the same conductivity as that added to the source or drain regions 18a and 18b is used. Accordingly, the impurity is not added to a portion where the control gate electrode 24 is formed, and the portion becomes LDD regions 313a and 313b. On the other hand, high concentration impurity regions 314a and 314b are formed in portions where the control gate electrode 24 is not formed. The high concentration impurity regions 314a and 314b serve as a source region or a drain region.

Figure 13C:
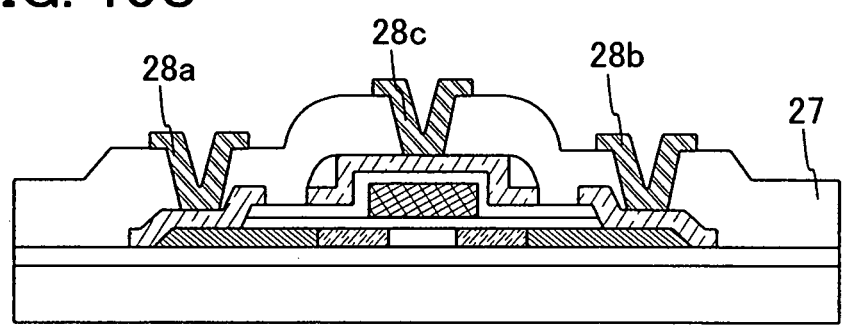

Then, an insulating film 27 is formed over the control gate electrode 24, the conductive layers 26a and 26b, and the like to form source or drain electrodes 28a and 28b and a gate wiring 28c, whereby a structure shown in FIG. 13C is completed.

In this embodiment mode, the conductive layers 26a and 26b are provided between the high concentration impurity regions 314a and 314b and the source or drain electrodes 28a and 28b, respectively. Accordingly, when the third insulating film 27 is etched, the etching is not performed up to the semiconductor layer, and increase in a contact resistance value can be prevented. Therefore, a memory that is capable of writing with high efficiency at a low voltage and has a favorable electric charge-holding characteristic can be manufactured.

Embodiment Mode 3

In this embodiment mode, a structure of a nonvolatile memory, which is different from the structures shown in FIG. 1 and FIG. 11, will be explained with reference to FIGS. 14A and 14B, FIGS. 15A to 15D, and FIGS. 16A and 16B.

Figure 14A:
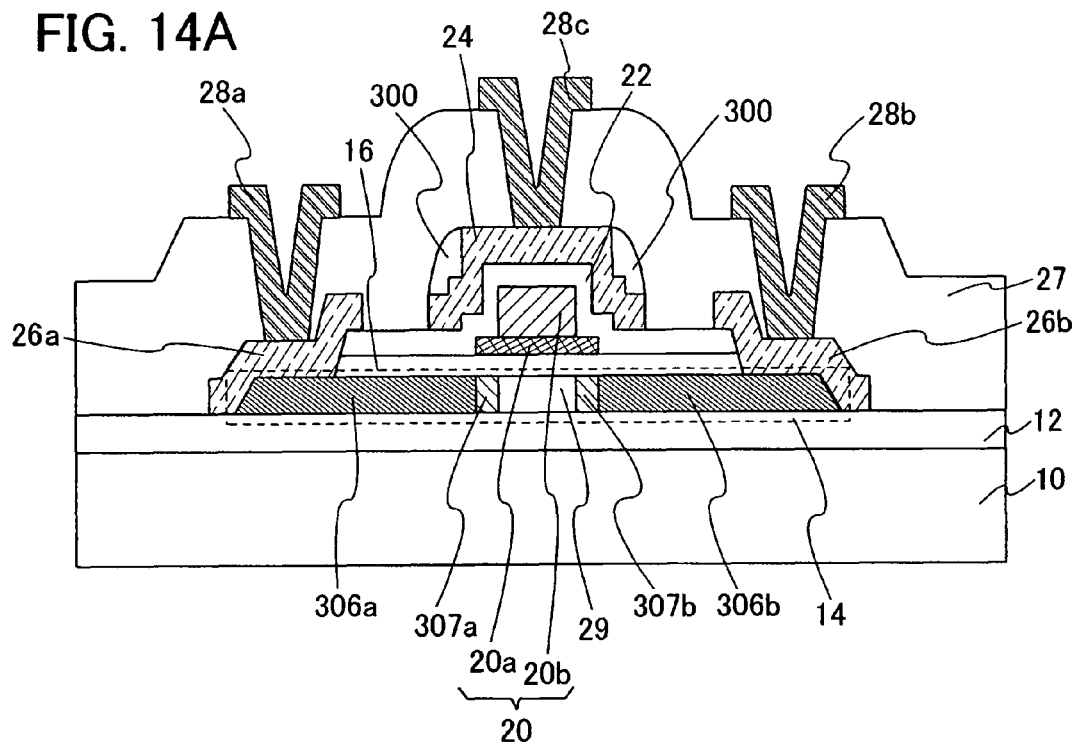
FIGS. 14A and 14B are cross-sectional views each explaining a main structure of a nonvolatile semiconductor storage device relating to the present invention.

In a nonvolatile memory element shown in FIG. 14A, first impurity regions (source or drain regions) 306a and 306b, second impurity regions 307a and 307b, and the like are provided in a semiconductor layer 14, and a floating gate electrode 20 is formed of a first floating gate electrode 20a and a second floating gate electrode 20b, which are different points from the structures shown in FIG. 1 and FIG. 11.

In a structure shown in FIG. 14A, a base insulating film 12 is formed over a substrate 10, and the semiconductor layer 14 having the first impurity regions 306a and 306b, the second impurity regions 307a and 307b, and a channel formation region 29 is formed over the base insulating film 12. A first insulating film 16 and conductive layers 26a and 26b are formed over the semiconductor layer 14, the floating gate electrode 20 is formed over the first insulating film 16, a second insulating film 22 is formed over the floating gate electrode 20 and the first insulating film 16, and a control gate electrode 24 is formed over the second insulating film 22. The control gate electrode 24 is provided with sidewalls 300. In addition, an insulating film 27 is formed over the first insulating film 22, the conductive layers 26a and 26b, the control gate electrode 24, and the sidewalls 300. Source or drain electrodes 28a and 28b are electrically connected to the first impurity regions 306a and 306b, respectively, through contact holes formed in the insulating film 27. A gate wiring 28c is electrically connected to the control gate electrode 24 through a contact hole formed in the insulating film 27. It is to be noted that the source or drain electrodes 28a and 28b and the first impurity regions 306a and 306b are electrically connected respectively through the conductive layers 26a and 26b. Further, an insulating film for planarization may be formed over the insulating film 27.

Next, a manufacturing method of the nonvolatile memory element shown in FIG. 14A will be explained. However, most part of this manufacturing method is duplicated with Embodiment Mode 2. Accordingly, here, a step different from that of Embodiment Mode 2, a step for forming the floating electrode 20, and a step for forming the first impurity region and the like will be explained.

Figure 15A:
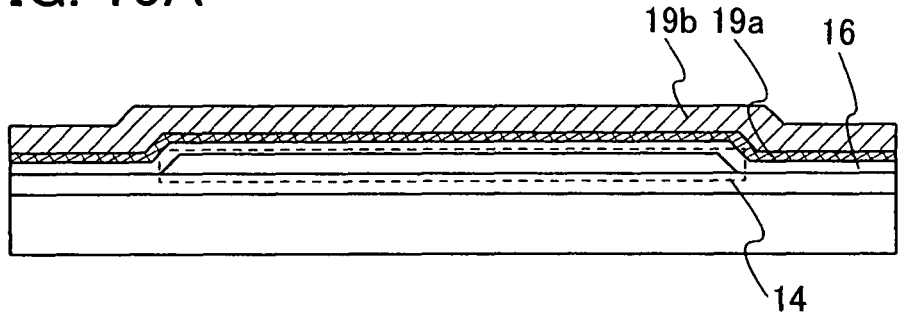
FIGS. 15A to 15D are views each showing an example of a manufacturing method of a nonvolatile semiconductor storage device of the present invention.

After the first insulating film 16 is formed over the semiconductor layer 14, a first conductive layer 19a is formed, and a second conductive layer 19b is formed over the first conductive layer 19a (FIG. 15A). It is preferable that the first conductive layer 19a and the second conductive layer 19b be each formed using a different conductive material. The first conductive layer 19a is preferably formed using a conductive material that has favorable adhesiveness with the first insulating film 16. For example, it is preferable to use titanium nitride (TiN), tantalum nitride (TaN), titanium (Ti), tantalum (Ta), tungsten (W), silicon (Si), or the like. In addition, the first conductive layer 19a is preferably formed to have a thickness in the range of greater than or equal to 25 nm and less than or equal to 35 nm.

The second conductive layer 19b is preferably formed using a conductive material that has low resistivity. For example, it is preferable to use a metal such as tungsten (W), molybdenum (Mo), aluminum (Al), or copper (Cu), an alloy or a metal compound containing the metal as its main component, or the like. As the alloy, an alloy of aluminum and silicon, an alloy of aluminum and neodymium, or the like can be given. As the metal compound, tungsten nitride or the like can be given. In addition, the second conductive layer is preferably formed to have a thickness in the range of greater than or equal to 100 nm and less than or equal to 600 nm.

A method for forming the first conductive layer 19a and the second conductive layer 19b is not particularly limited. Any method such as a sputtering method or an evaporation method may be used.

Figure 15B:
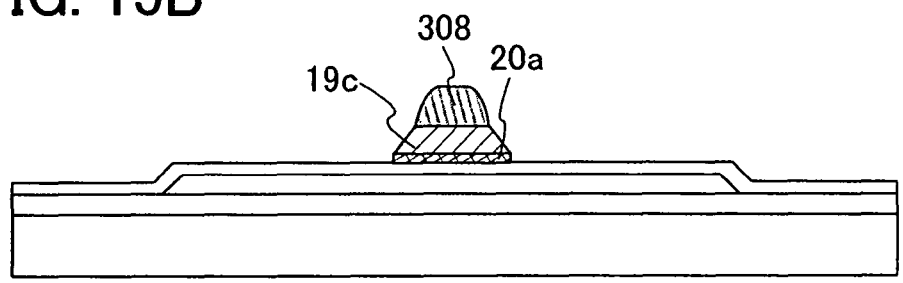

Next, a mask 308 is formed over the second conductive layer 19b. Then, the first conductive layer 19a and the second conductive layer 19b are etched to form the first floating gate electrode 20a and a third conductive layer 19c having such a shape that a side wall of each conductive layer has a gradient to a horizontal surface of the conductive layer (FIG. 15B).

Figure 15C:
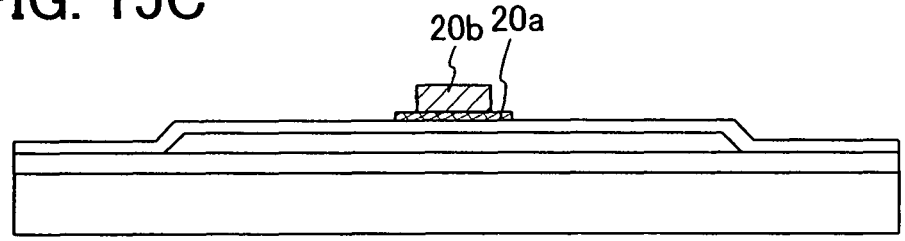

Subsequently, the third conductive layer 19c is selectively etched with the mask 308 to form the second floating gate electrode 20b. At this time, the second floating gate electrode 20b is preferably etched and processed under the high anisotropic condition so that a side wall of the second floating gate electrode 20b is vertical to the horizontal surface. In such a manner, the second floating gate electrode 20b having a shorter width (that is, the gate length is short) than the first floating gate electrode 20a is formed over the first floating gate electrode 20a provided on the first insulating film 16 side (FIG. 15C). In this embodiment mode, the combination of the first floating gate electrode 20a and the second floating gate electrode 20b is referred to as the floating gate electrode 20.

Figure 15D:
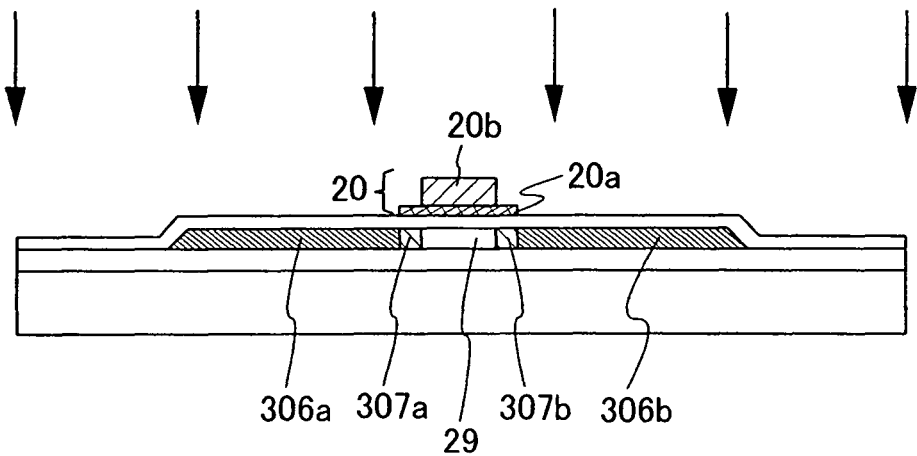

Then, an n-type or p-type impurity is added using the floating gate electrode 20 as a mask to form the first impurity regions 306a and 306b and the second impurity regions 307a and 307b (FIG. 15D). The second impurity regions 307a and 307b become a low concentration impurity region by the first floating gate electrode 20a. A portion sandwiched between the second impurity regions 307a and 307b becomes the channel formation region 29.

After the structure of FIG. 15D is manufactured, the sidewalls 300 are formed by a method shown in Embodiment Mode 2, and the control gate electrode 24 and the conductive layers 26a and 26b are formed. Then, the insulating film 27 is formed, and the source or drain electrodes 28a and 28b and the gate wiring 28c are formed, whereby the structure shown in FIG. 14A is completed.

Although, in this embodiment mode, the control gate electrode 24 is provided with the sidewalls 300, the sidewalls are not always needed to be provided. A structure in which the sidewalls are not provided as explained in Embodiment Mode 1 may be employed.

Figure 14B:
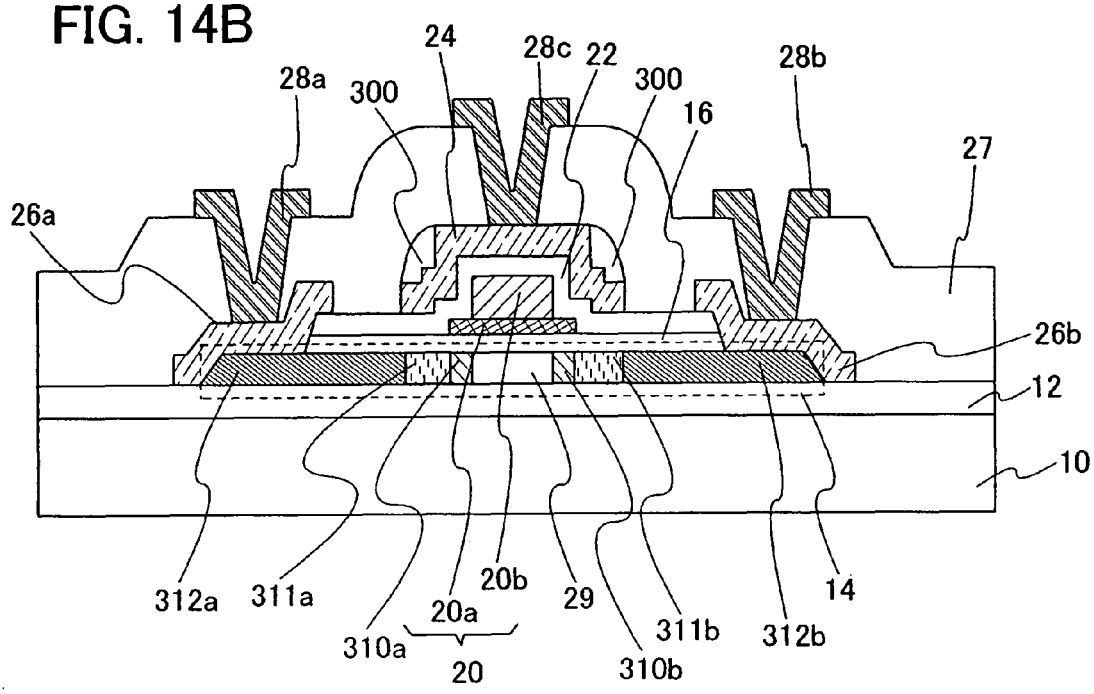

Further, as shown in FIG. 14B, a structure in which first impurity regions 312a and 312b, second impurity regions 311a and 311b, and third impurity regions 310a and 310b are provided may be employed. Here, the first impurity regions 312a and 312b each serve as a source region or a drain region.

Figure 16A:
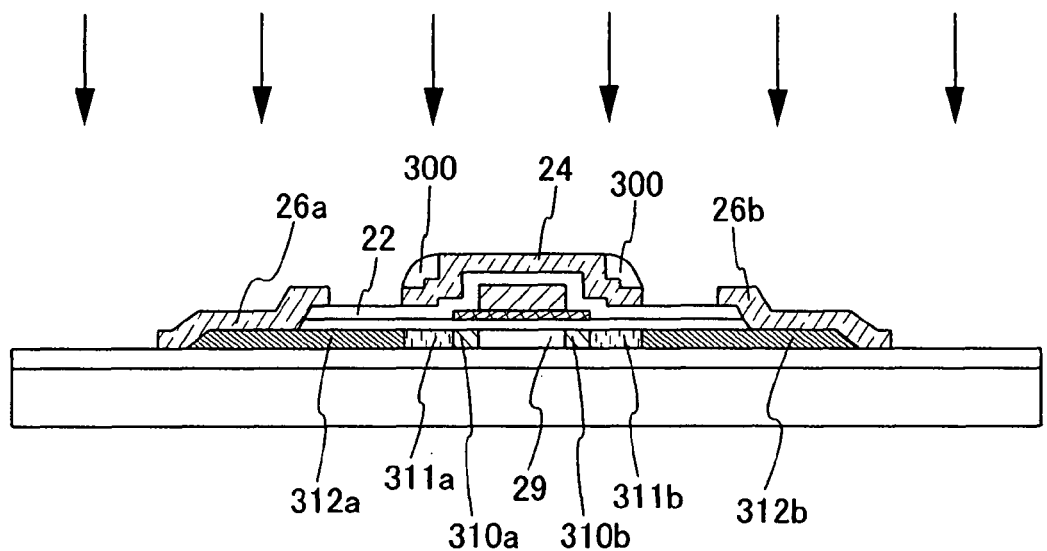
FIGS. 16A and 16B are views each showing an example of a manufacturing method of a nonvolatile semiconductor storage device of the present invention.

After the structure of FIG. 15D is manufactured, a second insulating film 22 as shown in FIG. 16A is formed by the method shown in Embodiment Mode 2, sidewalls 300 are formed, and a control gate electrode 24 and conductive layers 26a and 26b are formed.

Next, an n-type or p-type impurity is added. As the n-type or p-type impurity, an impurity imparting the same conductivity as that added to the first impurity regions and the second impurity regions is used. The impurity is not added below the control gate electrode 24, and then the first impurity regions 312a and 312b, the second impurity regions 311a and 311b, and the third impurity regions 310a and 310b can be formed. In this case, the concentration of the n-type or p-type impurity included in the first impurity regions 312a and 312b is higher than that of the n-type or p-type impurity included in the second impurity regions 311a and 311b. The concentration of the n-type or p-type impurity included in the second impurity regions 311a and 311b is higher than that of the n-type or p-type impurity included in the third impurity regions 310a and 310b.

Figure 16B:
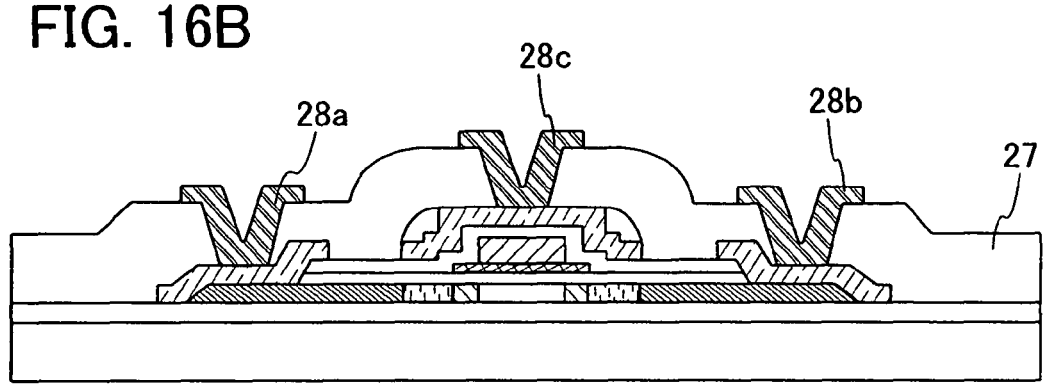

Then, as explained in Embodiment Mode 1, an insulating film 27 is formed over the control gate electrode 24, the conductive layers 26a and 26b, and the like, and the source or drain electrodes 28a and 28b and a gate wiring 28c are formed, whereby the structures shown in FIG. 16B and FIG. 14B are completed.

In this embodiment mode, the conductive layers 26a and 26b are provided between the first impurity regions 312a and 312b and the source or drain electrodes 28a and 28b. Accordingly, when the third insulating film 27 is etched, etching is not performed up to the semiconductor layer, and increase in a contact resistance value can be prevented. Therefore, a memory that is capable of writing with high efficiency at a low voltage and has a favorable electric charge-holding characteristic can be manufactured.

Hereinafter, a nonvolatile semiconductor storage device relating to the present invention will be explained. In a structure of the present invention explained below, reference numerals indicating the same factor are used in common in different drawings, and the repetitive explanation in that case may be omitted.

Embodiment 1

In this embodiment, one example of a manufacturing process of a nonvolatile semiconductor storage device will be explained with reference to drawings. Here, in the nonvolatile semiconductor storage device, a case is shown, in which a nonvolatile memory element included in a memory portion is formed over the same substrate, concurrently with an element such as a transistor included in a logic potion that performs control of the memory portion and the like. FIG. 5 shows a schematic diagram of the memory portion in the nonvolatile semiconductor storage device explained in this embodiment.

In the memory portion shown in this embodiment, a plurality of memory cells including a control transistor S and a nonvolatile memory element M is provided. In FIG. 5, one memory cell MS01 including a control transistor S01 and a nonvolatile memory element M01 is formed. Similarly, memory cells are formed, each of which includes a control transistor S02 and a nonvolatile memory element M02, a control transistor S03 and a nonvolatile memory element M03, a control transistor S11 and a nonvolatile memory element M11, a control transistor S12 and a nonvolatile memory element M12, and a control transistor S13 and a nonvolatile memory element M13.

A gate electrode of the control transistor S01 is connected to a word line WL1, one of a source and a drain is connected to a bit line BL0, and the other is connected to a source or a drain of the nonvolatile memory element M01. A gate electrode of the nonvolatile memory element M01 is connected to a word line WL11, one of the source and drain is connected to the source or drain of the control transistor S01, and the other is connected to a source line SL.

Since the control transistor provided in the memory portion has a high driving voltage as compared with the transistor provided in the logic portion, it is preferable to form each gate insulating film and the like of the transistor provided in the memory portion and of the transistor provided in the logic portion to have a different thickness. For example, in a case where a low driving voltage and small variation in threshold voltages are required, it is preferable to provide a thin film transistor having a thin gate insulating film. Meanwhile, in a case where a high driving voltage and a withstand voltage property of the gate insulating film are demanded, it is preferable to provide a thin film transistor having a thick gate insulating film.

Figure 17A:
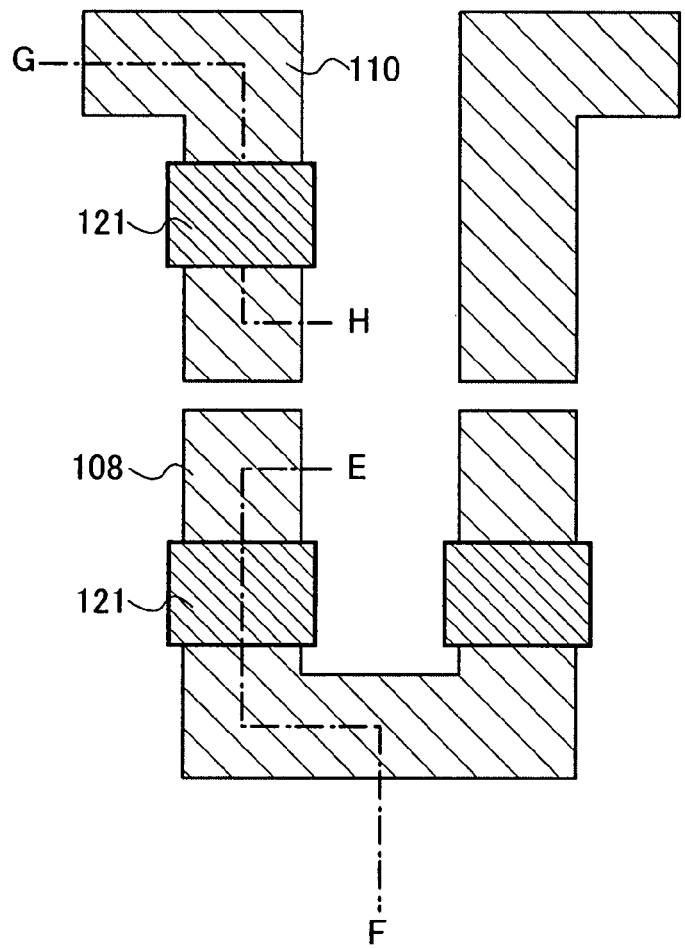
FIGS. 17A and 17B are views each showing an example of a top surface of a nonvolatile semiconductor storage device of the present invention.
Figure 17B:
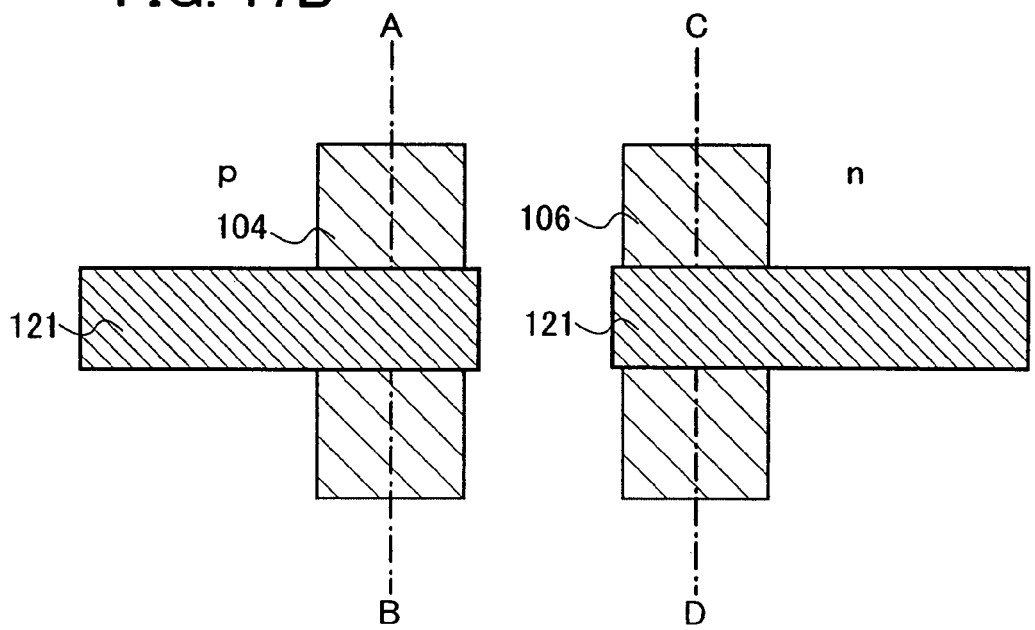
Figure 18A:
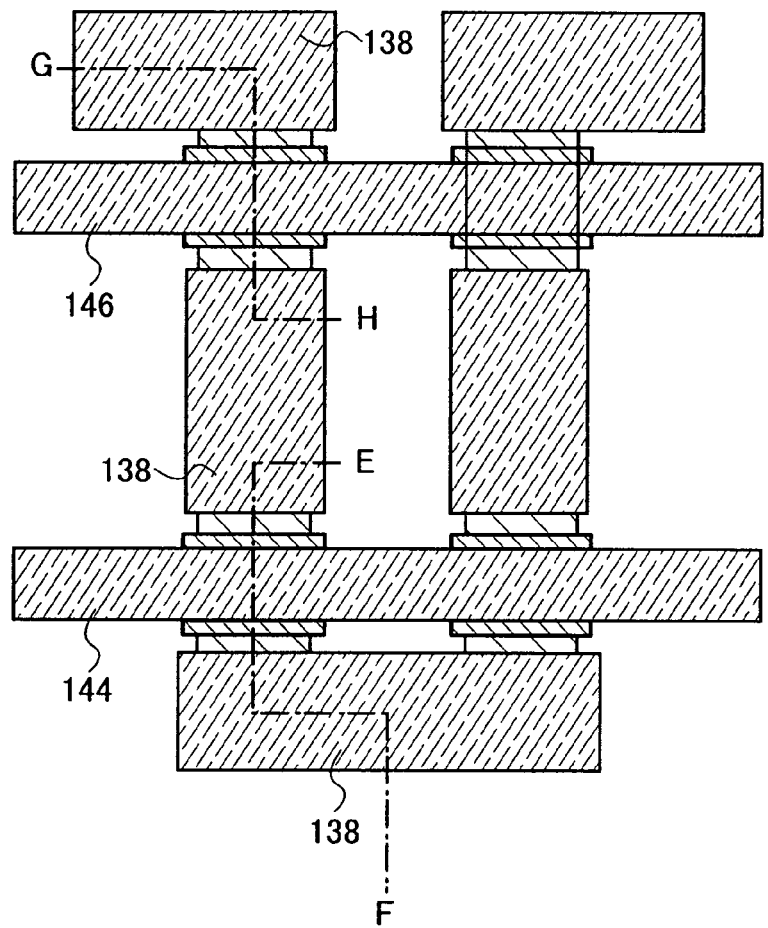
FIGS. 18A and 18B are views each showing an example of a top surface of a nonvolatile semiconductor storage device of the present invention.
Figure 18B:
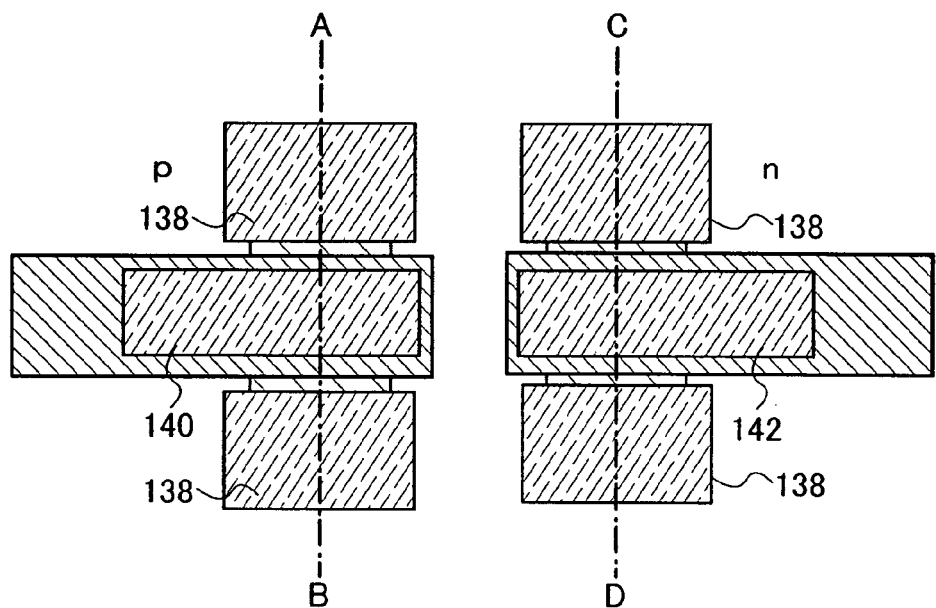
Figure 19A:
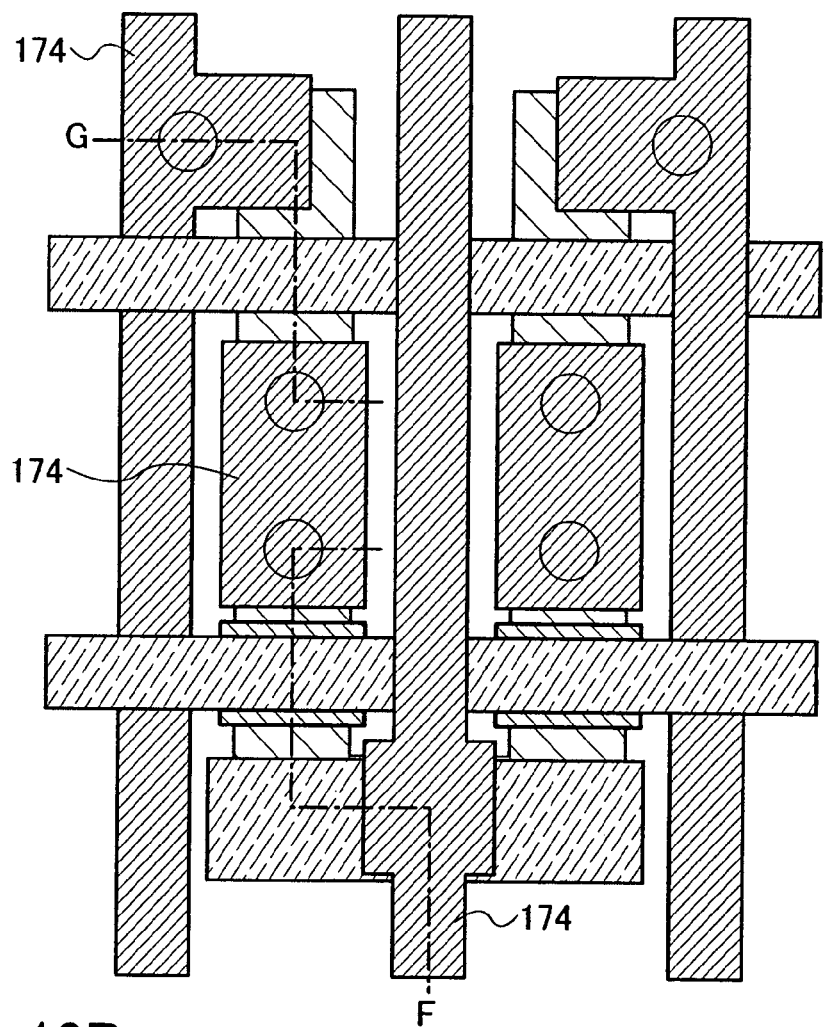
FIGS. 19A and 19B are views each showing an example of a top surface of a nonvolatile semiconductor storage device of the present invention.
Figure 19B:
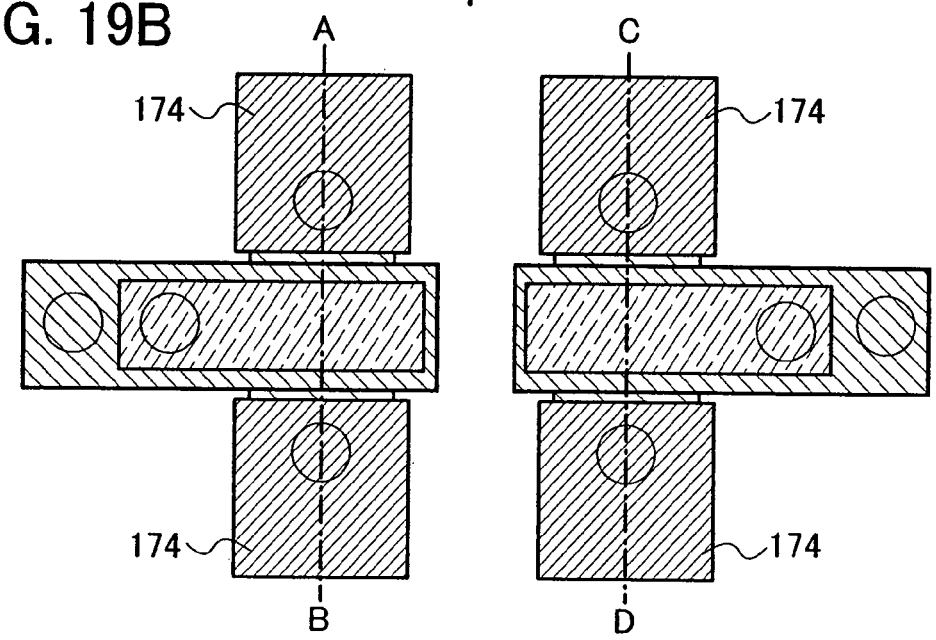

Accordingly, in this embodiment, a case will be explained with reference to drawings below, in which an insulating film with a thin thickness is formed for a transistor of a logic portion in which a low driving voltage and small variation in threshold voltages are required; and an insulating film with a thick thickness is formed for a transistor of a memory portion in which a high voltage and a withstand voltage property of a gate insulating film are demanded. FIG. 17A, FIG. 18A, and FIG. 19A each show a top view of an element in a memory portion, and FIG. 17B, FIG. 18B, and FIG. 19B each show a top view of an element in a logic portion. FIGS. 20A to 20C, FIGS. 21A to 21C, FIGS. 22A and 22B, FIGS. 23A and 23B, and FIG. 24 each show a cross-sectional view taken along a line A-B, a line C-D, a line E-F, and a line G-H of FIGS. 17A and 17B, FIGS. 18A and 18B, and FIGS. 19A and 19B. In the cross-sectional views, portions between A and B and between C and D indicate a thin film transistor provided in the logic portion. Portions between E and F indicate a nonvolatile memory element provided in the memory portion. Portions between G and H indicate a thin film transistor provided in the memory portion. Further, in this embodiment, a case is explained, where the thin film transistor provided between A and B is a p-channel type; the thin film transistors provided between C and D and between G and H are each a n-channel type; and movement of carriers of the nonvolatile memory element provided between E and F is performed by electrons. However, a nonvolatile semiconductor device of the present invention is not limited thereto.

First, island-shaped semiconductor layers 104, 106, 108, and 110 are formed over a substrate 100 with an insulating film 102 interposed therebetween, and first insulating films 112, 114, 116, and 118 are respectively formed to cover the island-shaped semiconductor layers 104, 106, 108, and 110 (FIG. 20A).

As the island-shaped semiconductor layers 104, 106, 108, and 110, an amorphous semiconductor layer is formed over the insulating film 102 that is formed in advance over the substrate 100, using a material containing silicon (Si) as its main component (for example, $Si_xGe_{1-x}$, or the like) or the like by a sputtering method, an LPCVD method, a plasma CVD method, or the like. After the amorphous semiconductor layer is crystallized, etching is selectively performed, whereby the island-shaped semiconductor layers 104, 106, 108, and 110 can be provided. It is to be noted that crystallization of the amorphous semiconductor layer can be performed by a laser crystallization method, a thermal crystallization method using RTA or an annealing furnace, a thermal crystallization method using a metal element promoting crystallization, a method in which these are combined, or the like.

When the crystallization or the recrystallization of the semiconductor layer is performed by laser irradiation, an LD-excitation continuous wave (CW) laser ($YVO_4$, second harmonic (wavelength: 532 nm)) can be used as a laser light source. The wavelength is not necessarily limited to the second harmonic, particularly; however, the second harmonic is superior to other higher harmonics in point of energy efficiency. When a semiconductor layer is irradiated with the CW laser, the semiconductor layer continuously receives energy; therefore, once the semiconductor layer is melted, the melted state can continue. Moreover, it is possible to move a solid-liquid interface of the semiconductor layer by scanning the CW laser and to form a crystal grain that is long in one direction along this moving direction. A solid laser is used because its output is so stable that stable treatment can be expected as compared with a gas laser or the like. Not only a CW laser but also a pulsed laser with a repetition rate of 10 MHz or more can be used. In a case of using a pulsed laser with a high repetition rate, when the pulse interval is shorter than the period after the semiconductor layer is melted and before the melted semiconductor layer is solidified, the semiconductor layer can normally maintain a melting state. Then, by moving the solid-liquid interface, the semiconductor layer including a crystal grain that is long in one direction can be formed. Another CW laser or pulsed laser with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. Moreover, a ceramic laser such as a YAG laser, a $Y_2O_3$ laser, a $GdVO_4$ laser, or a $YVO_4$ laser is given. As a metal vapor laser, a helium-cadmium laser or the like can be given. Moreover, oscillation of laser light with $TEM_{00}$ (single transverse mode) in a laser oscillator is preferable because the energy homogeneity of a linear beam spot on an irradiation surface can be raised. In addition, a pulsed excimer laser may be used.

The substrate 100 is one selected from a glass substrate, a quartz substrate, a metal substrate (for example, a stainless substrate), a ceramic substrate, or a semiconductor substrate such as a Si substrate. In addition, as a plastic substrate, a substrate formed of polyethylene terephthalate (PET), polyethylene naphthalate (PEN), polyether sulfone (PES), acrylic, or the like can be used.

The insulating film 102 is formed by a CVD method, a sputtering method, or the like, using an insulating material such as silicon oxide, silicon nitride, silicon oxynitride ($SiO_xN_y$) (x>y), or silicon nitride oxide ($SiN_xO_y$) (x>y). For example, in a case where the insulating film has a two-layer structure, a silicon nitride oxide film may be formed as an insulating film of a first layer, and a silicon oxynitride film may be formed as an insulating film of a second layer. Alternatively, a silicon nitride film may be formed as an insulating film of a first layer, and a silicon oxide film may be formed as an insulating film of a second layer. As described above, the insulating film 102 serving as a blocking layer is formed, whereby an alkali metal such as Na or an alkali earth metal from the substrate 100 can be prevented from giving an adverse affect to an element formed thereover. In a case where quartz is used as the substrate 100, the insulating film 102 may be omitted.

The first insulating films 112, 114, 116, and 118 can be formed by performing thermal treatment, plasma treatment, or the like to the semiconductor layers 104, 106, 108, and 110. For example, the semiconductor layers 104, 106, 108, and 110 are subjected to oxidation treatment, nitriding treatment, or oxynitriding treatment by high-density plasma treatment, whereby the first insulating films 112, 114, 116, and 118, which are to be an oxide film, a nitride film, or an oxynitride film, are formed over the semiconductor layers 104, 106, 108, and 110, respectively. It is to be noted that the first insulating films may be formed by a plasma CVD method or a sputtering method.

For example, in a case where oxidation treatment or nitriding treatment is performed by high-density plasma treatment, using a semiconductor layer containing Si as its main component as the semiconductor layers 104, 106, 108, and 110, a silicon oxide (SiOx) film or a silicon nitride (SiNx) film is formed as the first insulating films 112, 114, 116, and 118. Alternatively, after the semiconductor layers 104, 106, 108, and 110 are subjected to oxidation treatment by high-density plasma treatment, nitriding treatment may be performed by conducting high-density plasma treatment again. In this case, silicon oxide films are formed to be in contact with the semiconductor layers 104, 106, 108, and 110, and films including oxygen and nitrogen (hereinafter, referred to as "silicon oxynitride films") are formed over the silicon oxide film. The first insulating films 112, 114, 116, and 118 are each to be a film in which a silicon oxide film and a silicon oxynitride film are stacked.

Here, the first insulating films 112, 114, 116, and 118 are each formed to have a thickness of greater than or equal to 8 nm and less than or equal to 20 nm, preferably greater than or equal to 8 nm and less than or equal to 10 nm. For example, the semiconductor layers 104, 106, 108, and 110 are subjected to oxidation treatment by high-density plasma treatment to form a silicon oxide film with a thickness of about 10 nm on each surface of the semiconductor layers 104, 106, 108, and 110. Thereafter, nitriding treatment is performed by high-density plasma treatment to form a silicon oxynitride film with a thickness of about 2 nm on each surface of the silicon oxide films. In this case, a thickness of each silicon oxide film formed on the surface of the semiconductor layers 104, 106, 108, and 110 is about 8 nm. This is because the thickness of the silicon oxide film is reduced from the thickness of the formed silicon oxynitride film. At this time, it is preferable that the oxidation treatment and nitriding treatment by high-density plasma treatment be successively performed without being exposed to the atmospheric air absolutely. By performing high-density plasma treatment successively, prevention of mixture of contamination and improvement in productivity can be achieved.

In a case of oxidizing the semiconductor layers by high-density plasma treatment, the treatment is performed under an oxygen atmosphere. As the oxygen atmosphere, for example, an atmosphere including oxygen ($O_2$) and a rare gas; an atmosphere including dinitrogen monoxide ($N_2O$) and a rare gas; an atmosphere including oxygen, hydrogen ($H_2$), and a rare gas; or an atmosphere including dinitrogen monoxide, hydrogen, and a rare gas is given. As the rare gas, at least one of He, Ne, Ar, Kr, and Xe is included. On the other hand, in a case of nitriding the semiconductor layers by high-density plasma treatment, the plasma treatment is performed under a nitrogen atmosphere. As the nitrogen atmosphere, for example, an atmosphere including nitrogen ($N_2$) and a rare gas; an atmosphere including nitrogen, hydrogen, and a rare gas; or an atmosphere including $NH_3$ and a rare gas is given. As the rare gas, at least one of He, Ne, Ar, Kr, and Xe is included.

As the rare gas, for example, Ar can be used. Alternatively, a gas in which Ar and Kr are mixed may be used. In a case of performing high-density plasma treatment under a rare gas atmosphere, the first insulating layers 112, 114, 116, and 118 may include the rare gas (at least one of He, Ne, Ar, Kr, and Xe) that is used for the plasma treatment. When Ar is used, the first insulating layers 112, 114, 116, and 118 may include Ar.

Moreover, the high-density plasma treatment is performed in an atmosphere including the aforementioned gas with an electron density of $1\times10^{11}$ cm$^{-3}$ or more and plasma electron temperature of 1.5 eV or less. More specifically, the electron density is greater than or equal to $1\times10^{11}$ cm$^{-3}$ and less than or equal to $1\times10^{13}$ cm$^{-3}$ and the plasma electron temperature is greater than or equal to 0.5 eV and less than or equal to 1.5 eV. Since the plasma electron density is high and the electron temperature in the vicinity of an object to be processed that is formed over the substrate 100 (here, the semiconductor layers 104, 106, 108, and 110) is low, plasma damage on the object to be processed can be prevented. Moreover, since the plasma electron density is as high as $1\times10^{11}$ cm$^{-3}$ or more, an oxide film or a nitride film formed by oxidizing or nitriding the object to be processed by using the plasma treatment can be dense and superior in uniformity of its film thickness and the like as compared with a film formed by a CVD method, a sputtering method, or the like. Furthermore, since the plasma electron temperature is as low as 1.5 eV or less, oxidation treatment or nitriding treatment can be performed at a lower temperature than in conventional plasma treatment or a thermal oxidation method. For example, even plasma treatment at temperatures lower than the distortion point of a glass substrate by 100° C. or more can sufficiently perform oxidation treatment or nitriding treatment. When forming plasma, high frequency such as a microwave (for example, 2.45 GHz) can be used.

In this embodiment, in a case of performing oxidation treatment of the object to be processed by high-density plasma treatment, a mixture gas of oxygen (O$_2$), hydrogen (H$_2$), and argon (Ar) is introduced. The mixture gas used here may be introduced under the condition that oxygen is greater than or equal to 0.1 sccm and less than or equal to 100 sccm, hydrogen is greater than or equal to 0.1 sccm and less than or equal to 100 sccm, and argon is greater than or equal to 100 sccm and less than or equal to 5000 sccm. It is to be noted that the mixture gas is preferably introduced under the condition of a ratio of oxygen:hydrogen:argon=1:1:100. For example, oxygen may be 5 sccm, hydrogen may be 5 sccm, and argon may be 500 sccm.

In a case of performing nitriding treatment by high density treatment, a mixture gas of nitrogen (N$_2$) and argon (Ar) is introduced. The mixture gas used here may be introduced under the condition that nitrogen is greater than or equal to 20 sccm and less than or equal to 2000 sccm, and argon is greater than or equal to 100 sccm and less than or equal to 10000 sccm. For example, nitrogen may be 200 sccm, and argon may be 1000 sccm.

In this embodiment, the first insulating film 116 formed over the semiconductor layer 108 in the memory portion serves as a tunnel oxide film in a nonvolatile memory element to be completed later. Therefore, the thinner the first insulating film 116 is, the more easily the tunnel current flows, which allows a higher-speed operation as a memory. Further, when the first insulating film 116 is thinner, electric charges can be accumulated at a lower voltage in a floating gate to be formed later; therefore, the power consumption of a semiconductor device can be reduced. Accordingly, the first insulating films 112, 114, 116, and 118 are preferably formed to be thin.

In general, a thermal oxidation method is given as a method for forming a thin insulating film over a semiconductor layer. However, when a substrate of which melting point is not sufficiently high, such as a glass substrate, is used as the substrate 100, it is very difficult to form the first insulating films 112, 114, 116, and 118 by a thermal oxidation method. Moreover, an insulating film formed by a CVD method or a sputtering method does not have enough film quality because of a defect inside the film, and a problem may be caused, in that a defect such as a pinhole is produced when the film is formed to be thin. In addition, an insulating film formed by a CVD method or a sputtering method does not cover an end portion of the semiconductor layer sufficiently, resulting in that a conductive layer and the like to be later formed over the first insulating film 116 and the semiconductor layer may be in contact with each other to cause leakage. Thus, when the first insulating films 112, 114, 116, and 118 are formed by the high-density plasma treatment as shown in this embodiment, the insulating film can be denser than an insulating film formed by a CVD method, a sputtering method, or the like, and moreover, the first insulating films 112, 114, 116, and 118 can cover an end portion of the semiconductor layers 104, 106, 108, and 110, sufficiently. As a result, the high speed operation and an electric charge-holding characteristic as a memory can be improved. In a case of forming the first insulating films 112, 114, 116, and 118 by a CVD method or a sputtering method, after the insulating films are formed, high-density plasma treatment is performed, and each surface of the insulating films is preferably subjected to oxidation treatment, nitriding treatment, or oxynitriding treatment.

Thereafter, a resist 123 is formed over the first insulating films 112, 114, 116, and 118, and the first insulating film 118 formed over the semiconductor layer 110 is selectively removed so as to partially expose of the surface of the semiconductor layer 110. Then, an impurity element is introduced into the semiconductor layer 110 using a portion covered with the first insulating film 118 as a mask, whereby impurity regions 162 are formed (refer to FIG. 20B). As the impurity element, an impurity element imparting n-type conductivity or an impurity element imparting p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is introduced into the semiconductor layer 110 as the impurity element. It is to be noted that the impurity region 162 serves as a source region or a drain region.

Then, the resist 123 is removed, and a first conductive layer 120 is formed to cover the first insulating films 112, 114, 116, and 118 and the impurity regions 162 formed in the semiconductor layer 110 (FIG. 20C). In this embodiment, the first conductive layer 120 may be formed to have a thickness of greater than or equal to 10 nm and less than or equal to 50 nm in order to introduce an impurity easily into the semiconductor layer 110 in the subsequent step.

The first conductive layer 120 is formed by a sputtering method or a CVD method, using a film formed from an element selected from tantalum (Ta), titanium (Ti), molybdenum (Mo), tungsten (W), chromium (Cr), or silicon (Si), a film formed from a nitride of the element (typically, a tantalum nitride film, a tungsten nitride film, or a titanium nitride film), an alloy film combined with the elements (typically, a Mo—W alloy or a Mo—Ta alloy), or a silicide film of the element (typically, a tungsten silicide film, a titanium silicide film, or a nickel silicide film). An impurity such as phosphorus or boron may be added to the silicon film. Further, the first conductive layer 120 may be formed of germanium, a germanium compound film, or the like.

Next, the first conductive layer 120 that is formed over the first insulating films 112, 114, 116, and 118 is selectively removed. The first conductive layer partially remains over the semiconductor layers 104, 106, 108, and 110 to form second conductive layers 121 and 127 (FIGS. 17A and 17B, FIG. 21A). Here, the first conductive layer 120 formed over the semiconductor layers 104, 106, 108, and 110 is partially covered with a resist 122, and the first conductive layer 120 is etched to be selectively removed (FIG. 21A). Here, the conductive layer 120 over a channel formation region 160 sandwiched between impurity regions 162 in the semiconductor layer 110 is removed, and the second conductive layer 127 formed over the semiconductor layer 110 is formed so as to be in contact with the impurity regions 162 in the semiconductor layer 110. The second conductive layer 121 formed over the semiconductor layer 108 serves as a floating gate electrode of the memory portion.

Next, an impurity region is formed in a specific region of the semiconductor layers 106 and 108. Here, resists 124 are formed so as to cover the semiconductor layers 104 and 110, and an impurity element is introduced into the semiconductor layers 106 and 108 that are not covered with the resist 124 or the second conductive layer 121, whereby impurity regions 126 and 156 are formed (FIG. 21B). As the impurity element, an impurity element imparting n-type conductivity or an impurity element imparting p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is introduced into the semiconductor layers 106 and 108 as the impurity element. It is to be noted that the impurity regions 126 and 156 serve as a source region or a drain region.

Subsequently, an impurity region is formed in a specific region of the semiconductor layer 104. Here, the resists 124 covering the semiconductor layers 104 and 110 are removed, and a resist 164 is formed so as to cover the semiconductor layers 106, 108, and 110. An impurity element is introduced into the semiconductor layer 104 that is not covered with the resist 164 or the second conductive layer 121 over the semiconductor layer 104, whereby impurity regions 125 are formed (FIG. 21C). As the impurity element, an impurity element imparting n-type conductivity or an impurity element imparting p-type conductivity is used. As the n-type impurity element, phosphorus (P), arsenic (As), or the like can be used. As the p-type impurity element, boron (B), aluminum (Al), gallium (Ga), or the like can be used. Here, boron (B) is introduced into the semiconductor layer 104 as the impurity element. It is to be noted that the impurity regions 125 serve as a source region or a drain region.

Figure 22A:
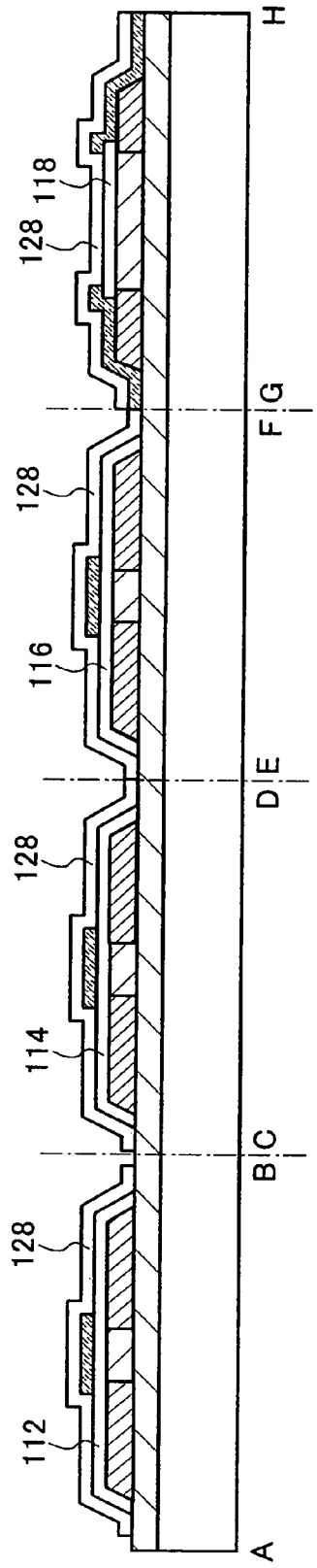
FIGS. 22A and 22B are views each showing an example of a manufacturing method of a nonvolatile semiconductor storage device of the present invention.

Next, a second insulating film 128 is formed over the second conductive layers 121 and 125 and the first insulating films 112, 114, 116, and 118 so as to cover the semiconductor layers 104, 106, 108, and 110 (FIG. 22A).

The second insulating film 128 is formed to have a single layer or stacked layers by a CVD method, a sputtering method, or the like, using an insulating material such as silicon oxide, silicon nitride, silicon oxynitride ($SiO_xN_Y$) (x>y), or silicon nitride oxide ($SiN_xO_Y$) (x>y). In a case where the second insulating film 128 is formed to have a single layer, for example, a silicon oxynitride film or a silicon nitride oxide film is formed to have a thickness of greater than or equal to 20 nm and less than or equal to 60 nm by a CVD method. In a case where the second insulating film 128 has a three-layer structure, a silicon oxynitride film is formed as an insulating film of a first layer, a silicon nitride film is formed as an insulating film of a second layer, and a silicon oxynitride film is formed as an insulating film of a third layer. Alternatively, as the second insulating film 128, a nitride of germanium may be used.

The second insulating film 128 formed above the semiconductor layer 108 serves as a control insulating film in a nonvolatile memory element that is completed later.

Figure 22B:
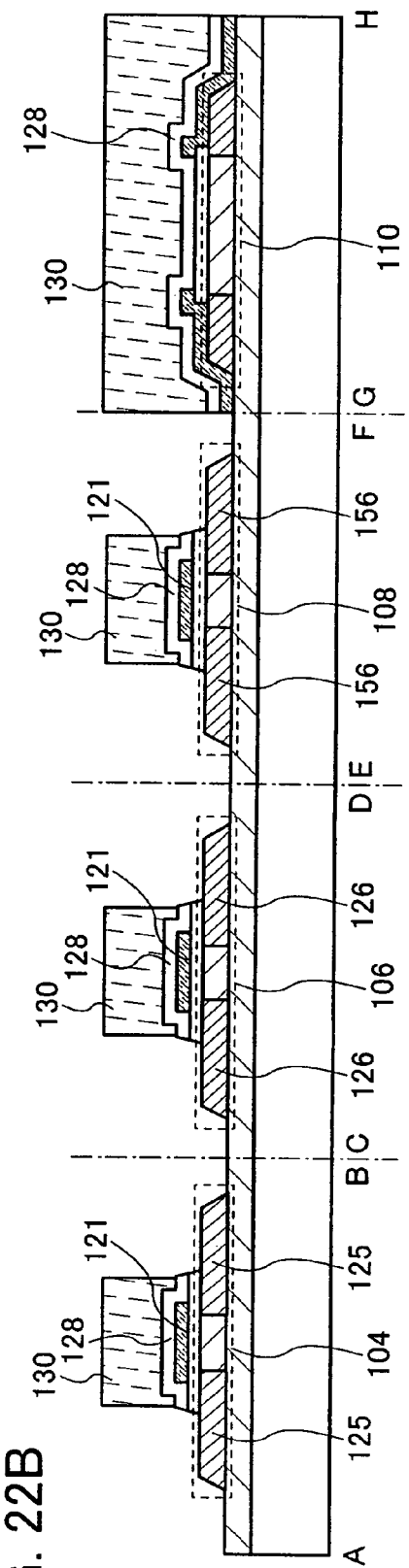
Figure 24:
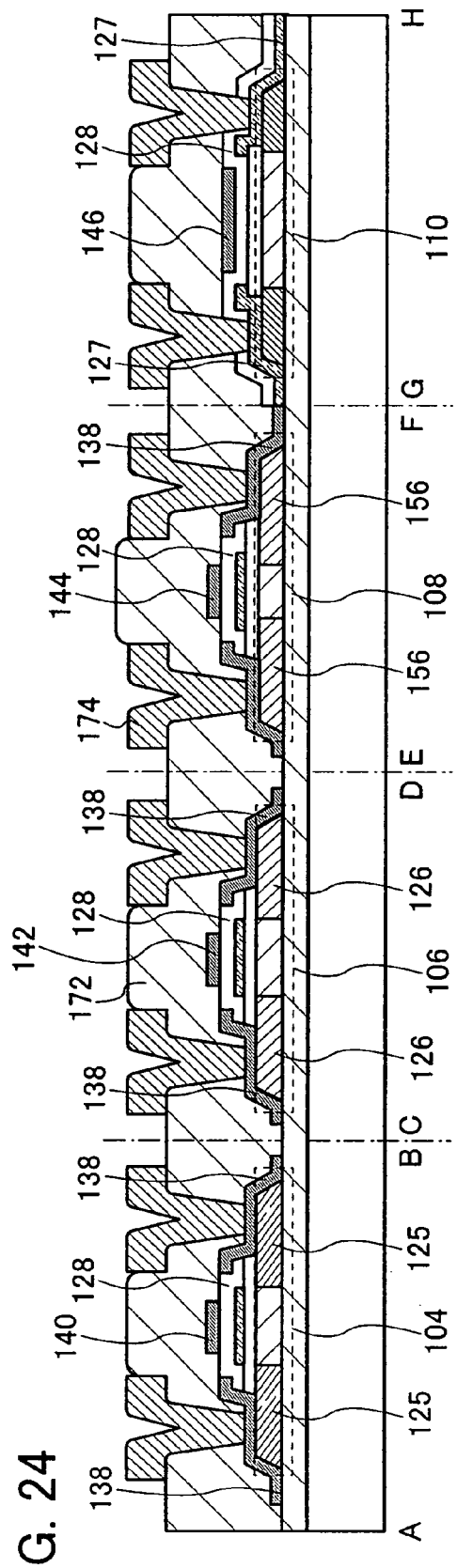
FIG. 24 is a view showing an example of a manufacturing method of a nonvolatile semiconductor storage device of the present invention.

Next, resists 130 are formed so as to cover the second insulating film 128 formed above the semiconductor layers 104, 106, 108, and 110 (FIG. 22B). It is to be noted that the resists 130 formed above the semiconductor layers 104, 106, and 108 are formed so as to cover the above part of the second conductive layer 121 and so as not to cover the above part of the impurity regions 125, 126, and 156. Thereafter, the second insulating film 128 is removed by etching so as to expose the part of the impurity regions 125, 126, and 156.

Subsequently, a conductive layer 136 is formed so as to cover the semiconductor layers 104, 106, 108, and 110 (refer to FIG. 23A). Here, as the conductive layer, an example in which the conductive layer 136 is formed to have a single layer is shown. As a matter of course, the conductive layer may be formed to have a stacked-layer structure of two layers or three or more layers.

The conductive layer 136 can be formed from an element selected from tantalum (Ta), tungsten (W), titanium (Ti), molybdenum (Mo), aluminum (Al), copper (Cu), chromium (Cr), or niobium (Nb), or an alloy material or a compound material containing the element as its main component. Alternatively, the conductive layer 136 can be formed of a metal nitride film in which these elements are nitrided. In addition, the conductive layer 136 can be formed from a semiconductor material typified by polycrystalline silicon doped with an impurity element such as phosphorus.

Here, the conductive layer 136 is formed using tungsten. Alternatively, as the conductive layer 136, a single layer selected from a tantalum nitride film, a tungsten nitride film, a molybdenum nitride film, and a titanium nitride film, or a stacked-layer film thereof can be used.

Subsequently, the conductive layer 136 is removed by selective etching, whereby the conductive layer 136 partially remains above the semiconductor layers 104, 106, 108, and 110 to form third conductive layers 140, 142, and 144 over the second conductive layers 121 each formed over the semiconductor layers 104, 106, and 108, and to form a third conductive layer 146 above the channel formation region 160 formed in the semiconductor layer 110. Further, the conductive layer 136 partially remains over the impurity regions 125, 126, and 156 in the semiconductor layers 104, 106, and 108 to form third conductive layers 138 (FIG. 23B and FIGS. 18A and 18B). It is to be noted that the conductive layer 144 formed above the semiconductor layer 108 in the memory portion serves as a control gate in a nonvolatile memory element that is completed later. The conductive layer 146 formed above the semiconductor layer 110 serves as a gate electrode in a transistor that is completed later. The conductive layer 140 formed over the semiconductor layer 104 is conducted to the second conductive layer 121, thereby serving as a gate electrode in a transistor in which the conductive layer 140 and the conductive layer 121 are completed later. The conductive layer 142 formed over the semiconductor layer 106 is conducted to the second conductive layer 121, thereby serving as a gate electrode in a transistor in which the conductive layer 142 and the conductive layer 121 are completed later.

Next, an insulating film 172 is formed so as to cover the second insulating film 128 and the third conductive layers 138, 140, 142, 144, and 146. Thereafter, a resist is selectively formed over the insulating film 172, and dry etching is performed to form contact holes for exposing the second conductive layer 127 and the third conductive layer 138. Then, conductive layers 174 that is in contact with the second conductive layer 127 and the third conductive layer 138 through the contact holes are formed (refer to FIG. 24 and FIGS. 19A and 19B). It is to be noted that the impurity regions 125, 126, 156, and 162 each formed in the semiconductor layers 104, 106, 108, and 110 are electrically connected to the conductive layer 174. Further, the conductive layer 174 serves as a source wiring or a drain wiring.

The insulating film 172 can be provided by a CVD method, a sputtering method, or the like, to have a single layer of an insulating film including oxygen or nitrogen such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film, a film including carbon such as a DLC (diamond like carbon) film, an organic material such as epoxy, polyimide, polyamide, polyvinyl phenol, benzocyclobutene, or acrylic, or a siloxane material such as a siloxane resin; or a stacked structure thereof. It is to be noted that the siloxane material corresponds to a material having Si—O—Si bonds. Siloxane has a skeleton structure of a bond of silicon (Si) and oxygen (O). As a substituent, an organic group including at least hydrogen (for example, an alkyl group) is used. As a substituent, a fluoro group can also be used. Alternatively, an organic group including at least hydrogen and a fluoro group may be used as a substituent.

The conductive layer 174 is formed to have a single layer or stacked layers by a CVD method, a sputtering method, or the like, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the element as its main component. The alloy material containing aluminum as its main component corresponds to, for example, a material containing aluminum as its component and nickel, or an alloy material containing aluminum as its main component, nickel, and one of or both carbon and silicon. The conductive layer 174 may have, for example, a stacked-layer structure of a barrier film, an aluminum silicon (Al—Si) film, and a barrier film, or a stacked-layer structure of a barrier film, an aluminum silicon (Al—Si) film, a titanium nitride (TiN) film, and a barrier film. It is to be noted that the barrier film corresponds to a thin film made from titanium, nitride of titanium, molybdenum, or nitride of molybdenum. Aluminum and aluminum silicon have a low resistance value and are inexpensive, which are optimum for a material of the conductive layer 174. When upper and lower barrier layers are provided, generation of a hillock of aluminum or aluminum silicon can be prevented. By forming the barrier film of titanium that is an element having a high reducing property, even when a thin natural oxide film is formed over a crystalline semiconductor layer, the natural oxide film can be reduced, so that favorable contact with the crystalline semiconductor layer can be formed.

In this embodiment, the third conductive layer is provided between the impurity region serving as a source region or a drain region and the wiring serving as a source electrode or a drain electrode. Therefore, when the insulating film provided over the third conductive layer is etched, etching is not performed up to the semiconductor layer, and increase in a contact resistance value can be prevented. Accordingly, a memory that is capable of writing with high efficiency at a low voltage and has a favorable electric charge-holding characteristic can be manufactured. As shown in this embodiment, the structure of the present invention is applied to a transistor in the logic portion in addition to the memory portion, whereby, increase in a contact resistance value can be further prevented, and a nonvolatile semiconductor storage device with a favorable property can be manufactured. This embodiment can be implemented by being combined with the embodiment modes or another embodiment shown in the present specification.

Embodiment 2

Figure 25:
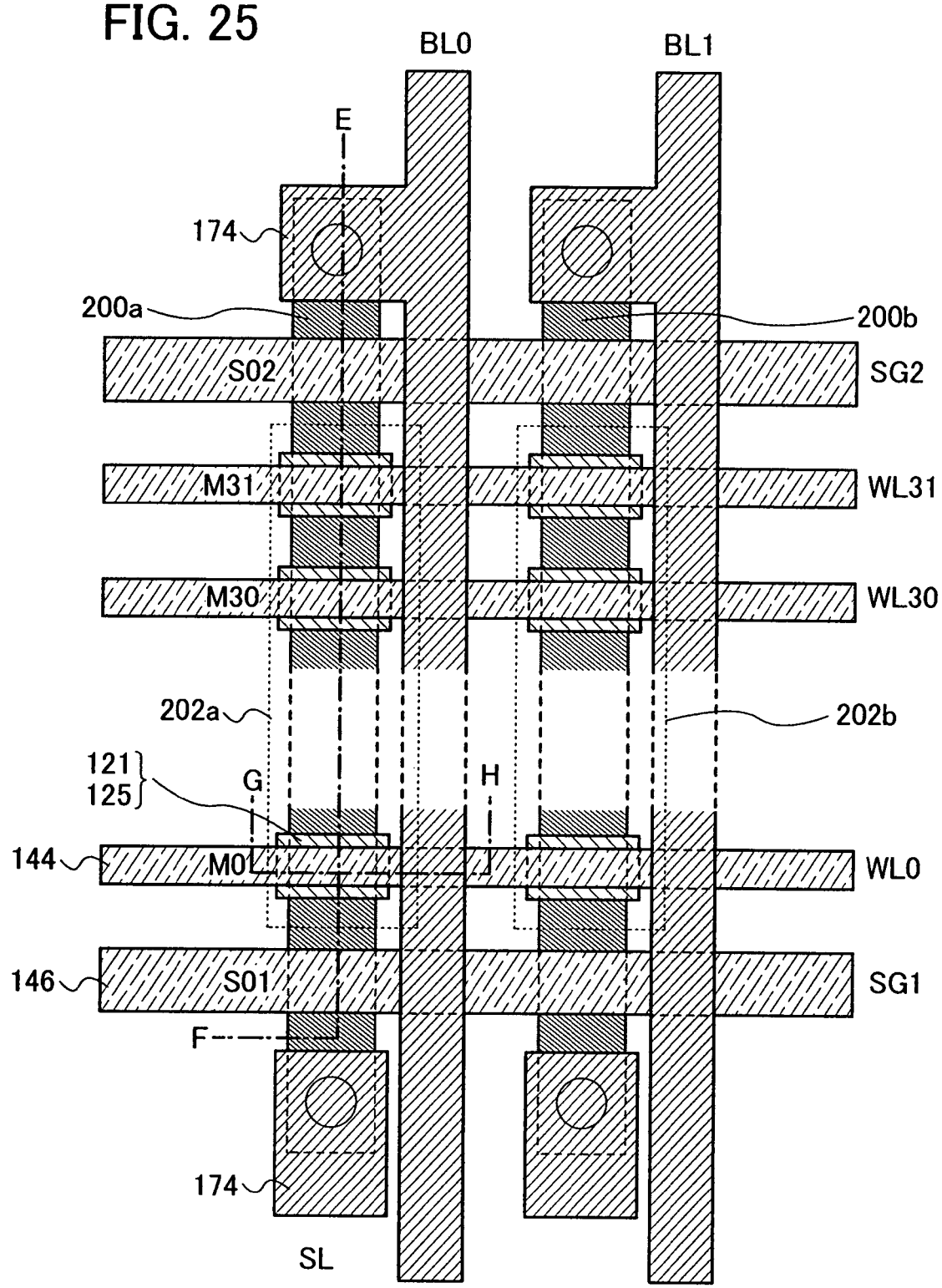
FIG. 25 is a view showing an example of a top surface of a nonvolatile semiconductor storage device of the present invention.
Figure 26A:
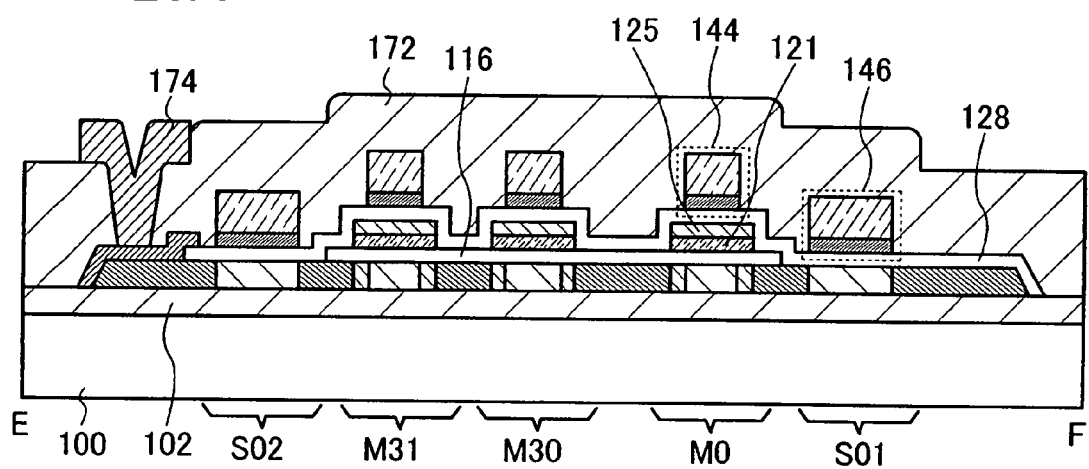
FIGS. 26A and 26B are views showing an example of a nonvolatile semiconductor storage device of the present invention.
Figure 26B:
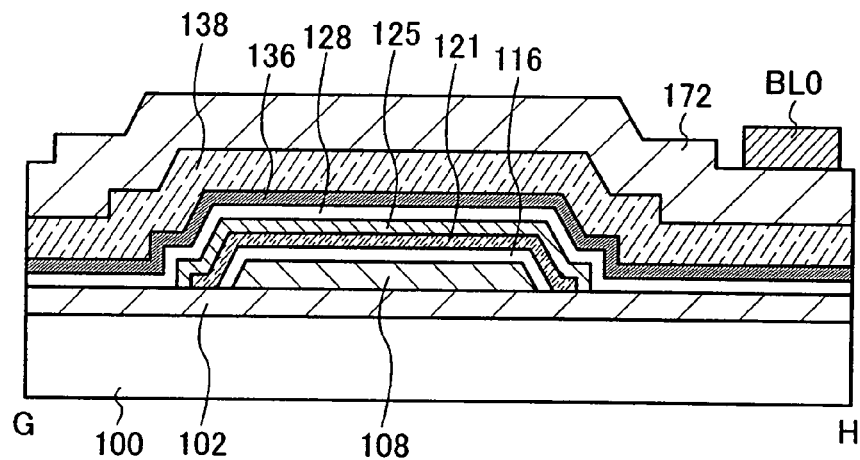

In this embodiment, a case where a plurality of nonvolatile memory elements is provided using one island-shaped semiconductor layer in the structure shown in Embodiment 1 will be explained with reference to drawings. In a case of indicating the same portion as that of the above embodiment, the same reference numeral is used, and repetitive explanation thereof is omitted. FIG. 25 shows a top view, and FIGS. 26A and 26B each show a cross-sectional view taken along a line E-F and a line G-H of FIG. 25.

In a nonvolatile semiconductor storage device shown in this embodiment, island-shaped semiconductor layers 200*a* and 200*b* that are electrically connected to bit lines BL0 and BL1, respectively, are provided. Each of the island-shaped semiconductor layers 200*a* and 200*b* is provided with a plurality of nonvolatile memory elements (refer to FIG. 25 and FIGS. 26A and 26B). Specifically, in the semiconductor layer 200*a*, a NAND cell 202*a* including a plurality of nonvolatile memory elements M0 to M31 is provided between selection transistors S01 and S02. In the semiconductor layer 200*b*, a NAND cell 202*b* including a plurality of nonvolatile memory elements is provided between the selection transistors. By the semiconductor layers 200*a* and 200*b* being provided separately, the NAND cell 202*a* and the NAND cell 202*b*, which are adjacent, can be insulated.

A plurality of nonvolatile memory elements is provided using one island-shaped semiconductor layer, whereby integration of the nonvolatile memory elements is further possible, and a nonvolatile semiconductor storage device with large capacity can be formed.

This embodiment can be implemented by being combined with embodiment modes or another embodiment mode will be performed.

Embodiment 3

In this embodiment, an application example of a semiconductor device provided with the aforementioned nonvolatile semiconductor storage device of the present invention, in which data can be input and output without contact, will be explained with reference to drawings. The semiconductor device in which data can be input and output without contact is referred to as an RFID tag, an ID tag, an IC tag, an IC chip, an RF tag, a wireless tag, an electron tag, or a wireless chip depending on the usage mode.

Figure 27A:
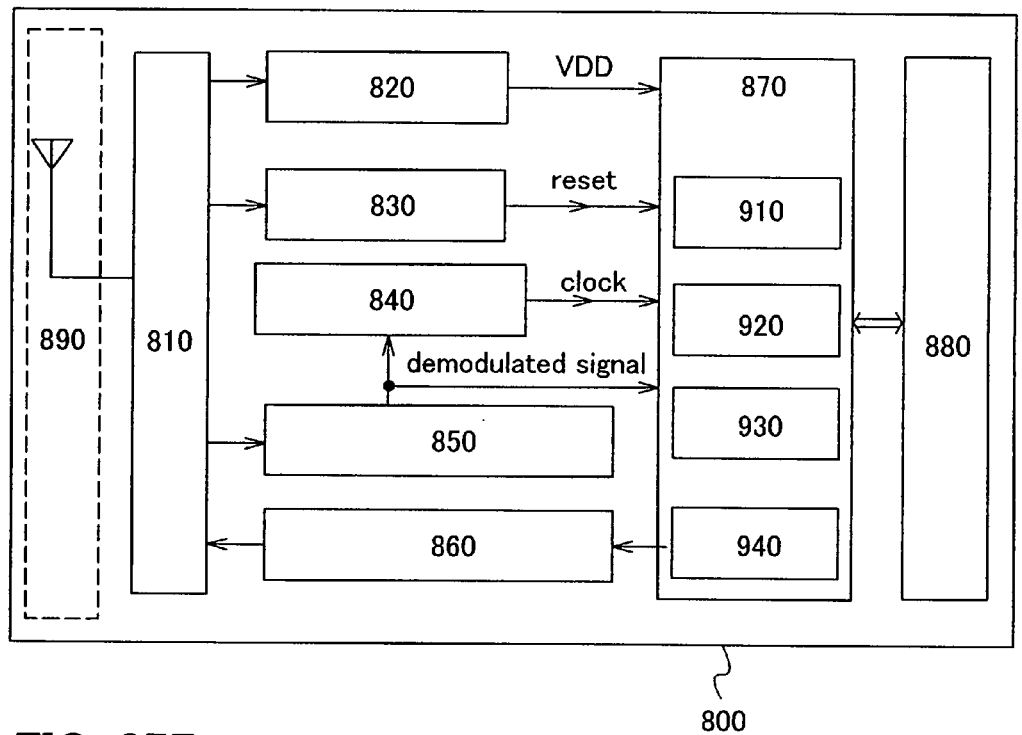
FIGS. 27A to 27C are views each showing an example of a usage pattern of a nonvolatile semiconductor storage device of the present invention.

A semiconductor device 800 has a function of exchanging data without contact, and includes a high-frequency circuit 810, a power supply circuit 820, a reset circuit 830, a clock generating circuit 840, a data demodulating circuit 850, a data modulating circuit 860, a control circuit 870 for controlling another circuit, a storage circuit 880, and an antenna 890 (FIG. 27A). The high-frequency circuit 810 receives a signal from the antenna 890 and outputs a signal, which is received from the data modulating circuit 860, from the antenna 890. The power supply circuit 820 generates power supply potential from a received signal. The reset circuit 830 generates a reset signal. The clock generating circuit 840 generates various clock signals based on a received signal input from the antenna 890. The data demodulating circuit 850 demodulates a received signal and outputs the demodulated signal to the control circuit 870. The data modulating circuit 860 modulates a signal received from the control circuit 870. As the control circuit 870, for example, a code extracting circuit 910, a code judging circuit 920, a CRC judging circuit 930, and an output unit circuit 940 are provided. It is to be noted that the code extracting circuit 910 extracts each of plural codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

Subsequently, an example of operation of the aforementioned semiconductor device is explained. First, a wireless signal is received by the antenna 890 and then sent to the power supply circuit 820 through the high-frequency circuit 810, whereby high power supply potential (hereinafter referred to as VDD) is generated. The VDD is supplied to each circuit in the semiconductor device 800. A signal sent to the data demodulating circuit 850 through the high-frequency circuit 810 is demodulated (hereinafter this signal is referred to as a demodulated signal). Moreover, signals passed through the reset circuit 830 and the clock generating circuit 840 via the high-frequency circuit 810, and the demodulated signal are sent to the control circuit 870. The signals sent to the control circuit 870 are analyzed by the code extracting circuit 910, the code judging circuit 920, the CRC judging circuit 930, and the like. Then, based on the analyzed signals, the information of the semiconductor device stored in the storage circuit 880 is output. The output information of the semiconductor device is encoded through the output unit circuit 940. Further, the encoded information of the semiconductor device 800 passes through the data modulating circuit 860 and then is sent by the antenna 890 as a wireless signal. It is to be noted that low power supply potential (hereinafter referred to as VSS) is common in the plural circuits included in the semiconductor device 800 and VSS can be GND. A nonvolatile semiconductor storage device of the present invention can be applied to the storage circuit 880. In the nonvolatile semiconductor storage device of the present invention, a driving voltage can be lowered; therefore, a distance in which data can be communicated without contact can be increased.

In such a manner, when a signal is sent from a reader/writer to the semiconductor device 800 and the signal sent from the semiconductor device 800 is received by the reader/writer, the data in the semiconductor device can be read.

Moreover, in the semiconductor device 800, a power supply voltage may be supplied to each circuit by electromagnetic waves without mounting a power supply (battery), or a power supply (battery) may be mounted so that a power supply voltage is supplied to each circuit by both electromagnetic waves and the power supply (battery) that is mounted.

Figure 27B:
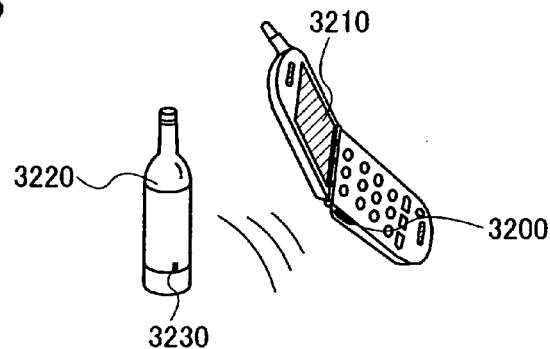
Figure 27C:
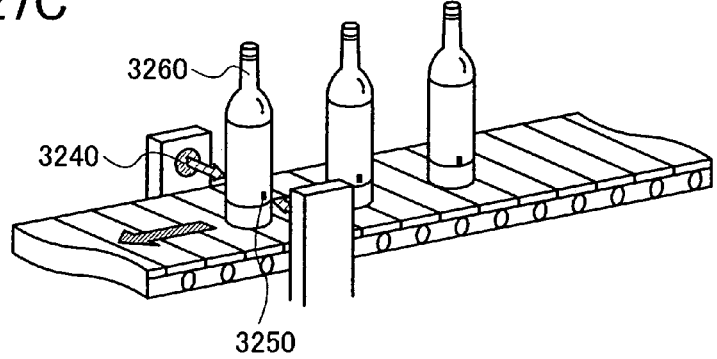

Next, an example of usage of a semiconductor device in which data can be input and output without contact is explained. A side surface of a mobile terminal including a display portion 3210 is provided with a reader/writer 3200. A side surface of a product 3220 is provided with a semiconductor device 3230 (FIG. 27B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected by using a semiconductor device 3250 provided to the product 3260 and a reader/writer 3240 (FIG. 27C). In such a manner, by using the semiconductor device in the system, information can be obtained easily and higher performance and higher value addition are achieved.

The nonvolatile semiconductor storage device of the present invention can be used for various fields of electronic devices provided with a memory. For example, as an electronic device to which the nonvolatile semiconductor storage device of the present invention is applied, a camera such as a video camera and a digital camera, a goggle type display (a head mount display), a navigation system, an audio reproducing device (car audio set, audio component set, or the like), a computer, a game machine, a mobile information terminal (mobile computer, mobile phone, portable game machine, electronic book, or the like), and an image reproducing device provided with a recording medium (specifically, a device provided with a display that can reproduce a recording medium such as a Digital Versatile Disc (DVD) and display the image), and the like can be given. Specific examples of such electronic devices are shown in FIGS. 28A to 28E.

Figure 28A:
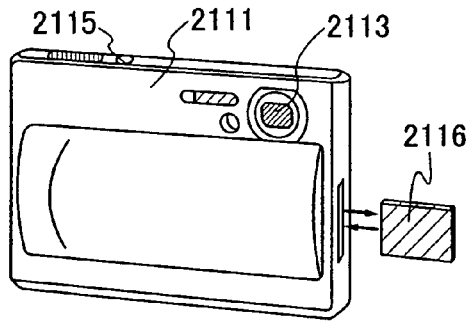
FIGS. 28A to 28E are views each showing an example of a usage pattern of a nonvolatile semiconductor storage device of the present invention.
Figure 28B:
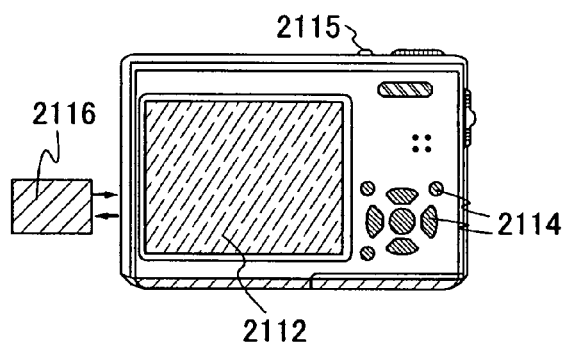

FIGS. 28A and 28B show a digital camera. FIG. 28B is a view showing a rear side of FIG. 28A. This digital camera includes a chassis 2111, a display portion 2112, a lens 2113, operation keys 2114, a shutter 2115, and the like. In addition, the digital camera is provided with a nonvolatile memory 2116 that can be detached, and has a structure in which data photographed by the digital camera is stored in the memory 2116. A nonvolatile semiconductor storage device that is formed by implementation of the present invention can be applied to the memory 2116.

Figure 28C:
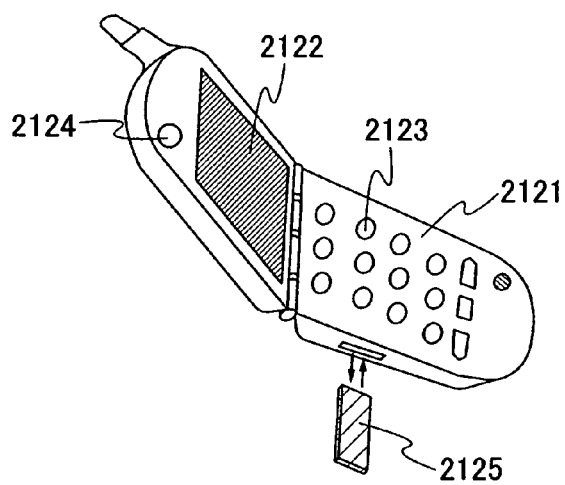

FIG. 28C shows a mobile phone, which is a typical example of a mobile terminal. This mobile phone includes a chassis 2121, a display portion 2122, operation keys 2123, and the like. Further, this mobile phone is provided with a nonvolatile memory 2125 that can be detached, in which data such as a telephone number of the mobile phone, an image, music data, and the like can be stored and reproduced. A nonvolatile semiconductor storage device that is formed by implementing the present invention can be applied to the memory 2125.

Figure 28D:
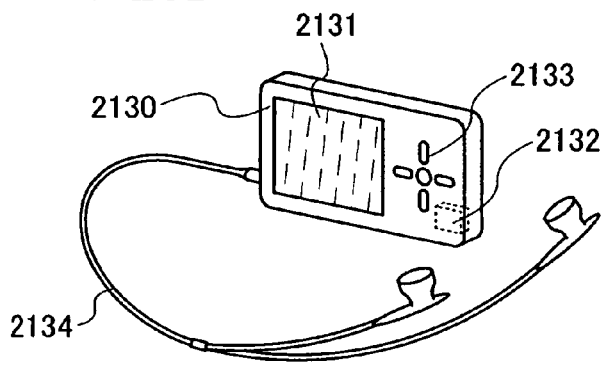

FIG. 28D shows a digital player, which is a typical example of an audio reproducing device. The digital player shown in FIG. 28D includes a main body 2130, a display portion 2131, a memory portion 2132, an operation portion 2133, an earphone 2134, and the like. Instead of the earphone 2134, a headphone or a wireless earphone can be used. A nonvolatile semiconductor storage device that is formed by implementing the present invention can be used for the memory portion 2132. For example, a NAND-type nonvolatile memory in which memory capacity is greater than or equal to 20 gigabyte (GB) and less than or equal to 200 gigabyte (GB) is used to operate the operation portion 2133, whereby image and sound (music) can be recorded and reproduced. The display portion 2131 can suppress power consumption through display of white characters on the black background. This is particularly effective in a mobile audio device. It is to be noted that the nonvolatile semiconductor storage device provided in the memory portion 2132 may have a detachable structure.

Figure 28E:
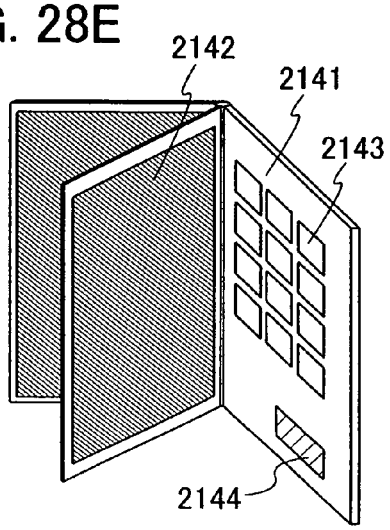
Figure 29:
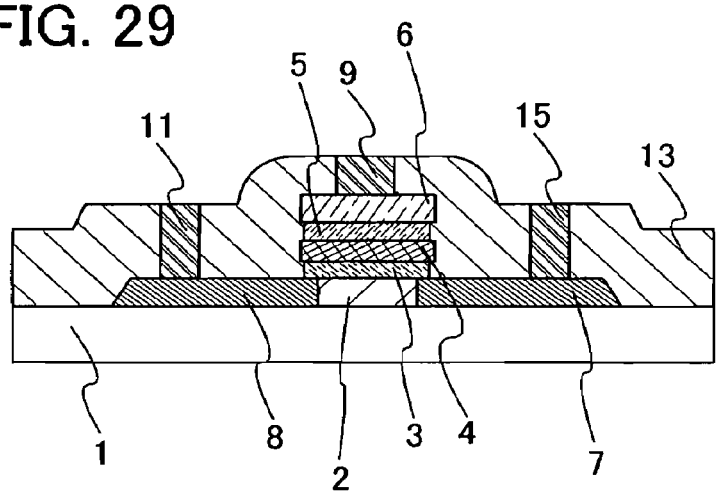
FIG. 29 is a view explaining a structure of a conventional nonvolatile semiconductor storage device.

FIG. 28E shows an electronic book (also referred to as an electronic paper). This electronic book includes a main body 2141, a display portion 2142, operation keys 2143, and a memory portion 2144, and the like. Further, a modem may be incorporated in the main body 2141, or a structure in which information can be sent and received without contact may be made. A nonvolatile semiconductor storage device that is formed by implementation of the present invention can be used for the memory portion 2144. For example, a NAND-type nonvolatile memory in which memory capacity is greater than or equal to 20 gigabyte (GB) and less than or equal to 200 gigabyte (GB) is used to operate the operation keys 2143, whereby image and sound (music) can be recorded and reproduced. It is to be noted that the nonvolatile semiconductor storage device provided in the memory portion 2144 may have a detachable structure.

As described above, the application range of the nonvolatile semiconductor storage device of the present invention is extremely wide and can be used for various fields of electronic devices as long as they have a memory.

This application is based on Japanese Patent Application serial no. 2006-101254 filed in Japan Patent Office on Mar. 31, 2006, the entire contents of which are hereby incorporated by reference.

What is claimed is:

1. A nonvolatile semiconductor storage device comprising:
a semiconductor layer including a channel formation region, a first region, and a second region;
a first insulating film over the semiconductor layer;
a floating gate electrode over the first insulating film;
a second insulating film over and in direct contact with the floating gate electrode;
a control gate electrode over and in direct contact with the second insulating film;
a first conductive layer over the first region and a second conductive layer over the second region;
a third insulating film over the second insulating film, the control gate electrode, the first conductive layer, and the second conductive layer; and
at least one electrode over the third insulating film and contacting one of the first conductive layer and the second conductive layer through a contact hole of the third insulating film,
wherein the first conductive layer comprises a same conductive layer as the control gate electrode,
wherein the second conductive layer comprises the same conductive layer as the control gate electrode,
wherein at least one of the first conductive layer and the second conductive layer is in contact with the first insulating film and the second insulating film, and
wherein the floating gate electrode comprises a semiconductor material of which resistivity is lower than that of the semiconductor layer.

2. A nonvolatile semiconductor storage device according to claim 1, further comprising a second electrode formed over the third insulating film and contacting the other one of the first conductive layer and the second conductive layer through a second contact hole of the third insulating film.

3. A nonvolatile semiconductor storage device according to claim 1,
wherein a material of the floating gate electrode is at least one selected from the group consisting of germanium, a germanium compound, an oxide of germanium, an oxide of a germanium compound, a nitride of germanium, a nitride of a germanium compound, an oxide including germanium, an oxide including a germanium compound, a nitride including germanium, and a nitride including a germanium compound.

4. A nonvolatile semiconductor storage device according to claim 1,
wherein the floating gate electrode has a stacked structure of a first floating gate electrode and a second floating gate electrode.

5. A nonvolatile semiconductor storage device according to claim 4,
wherein the first floating gate electrode is provided over the first insulating film, and the second floating gate electrode having a shorter width than the first floating gate electrode is provided over the first floating gate electrode.

6. A nonvolatile semiconductor storage device according to claim 4,
wherein a material of the first floating gate electrode is at least one selected from the group consisting of germanium, a germanium compound, an oxide of germanium, an oxide of a germanium compound, a nitride of germanium, a nitride of a germanium compound, an oxide including germanium, an oxide including a germanium compound, a nitride including germanium, and a nitride including a germanium compound, and
wherein a material of the second floating gate electrode is at least one selected from the group consisting of silicon and a silicon compound.

7. A nonvolatile semiconductor storage device comprising:
a semiconductor layer including a channel formation region, a first region, and a second region;
a first insulating film over the semiconductor layer;
a floating gate electrode over the first insulating film;
a second insulating film over and in direct contact with the floating gate electrode;
a control gate electrode over and in direct contact with the second insulating film;
a first conductive layer over the first region and a second conductive layer over the second region;
a third insulating film over the second insulating film, the control gate electrode, the first conductive layer, and the second conductive layer; and
at least one electrode over the third insulating film and contacting one of the first conductive layer and the second conductive layer through a contact hole of the third insulating film,
wherein the control gate electrode is formed to cover the floating gate electrode through the second insulating film, and
wherein the control gate electrode is provided with a sidewall,
wherein the first conductive layer comprises a same conductive layer as the control gate electrode,
wherein the second conductive layer comprises the same conductive layer as the control gate electrode,
wherein at least one of the first conductive layer and the second conductive layer is in contact with the first insulating film and the second insulating film, and
wherein the floating gate electrode comprises a semiconductor material of which resistivity is lower than that of the semiconductor layer.

8. A nonvolatile semiconductor storage device according to claim 7, further comprising a second electrode formed over the third insulating film and contacting the other one of the first conductive layer and the second conductive layer through a second contact hole of the third insulating film.

9. A nonvolatile semiconductor storage device according to claim 7,
wherein a material of the floating gate electrode is at least one selected from the group consisting of germanium, a germanium compound, an oxide of germanium, an oxide of a germanium compound, a nitride of germanium, a nitride of a germanium compound, an oxide including germanium, an oxide including a germanium compound, a nitride including germanium, and a nitride including a germanium compound.

10. A nonvolatile semiconductor storage device according to claim 7,
wherein the floating gate electrode has a stacked structure of a first floating gate electrode and a second floating gate electrode.

11. A nonvolatile semiconductor storage device according to claim 10,
wherein the first floating gate electrode is provided over the first insulating film, and the second floating gate electrode having a shorter width than the first floating gate electrode is provided over the first floating gate electrode.

12. A nonvolatile semiconductor storage device according to claim 10,
wherein a material of the first floating gate electrode is at least one selected from the group consisting of germanium, a germanium compound, an oxide of germanium, an oxide of a germanium compound, a nitride of germanium, a nitride of a germanium compound, an oxide including germanium, an oxide including a germanium compound, a nitride including germanium, and a nitride including a germanium compound, and
wherein a material of the second floating gate electrode is at least one selected from the group consisting of silicon and a silicon compound.

13. A nonvolatile semiconductor storage device according to claim 1,
wherein the first conductive layer is in contact with a side surface of the semiconductor layer.

14. A nonvolatile semiconductor storage device according to claim 7,
wherein the first conductive layer is in contact with a side surface of the semiconductor layer.

15. A nonvolatile semiconductor storage device according to claim 1,
wherein the first insulating film comprises an oxide semiconductor layer and a nitride semiconductor layer performed by plasma treatment.

16. A nonvolatile semiconductor storage device according to claim 7,
wherein the first insulating film comprises an oxide semiconductor layer and a nitride semiconductor layer performed by plasma treatment.

17. A nonvolatile semiconductor storage device according to claim 1, wherein an electrode formed over the third insulating film and connecting the control gate electrode.

18. A nonvolatile semiconductor storage device according to claim 7,
wherein an electrode formed over the third insulating film and connecting the control gate electrode.

* * * * *